United States Patent [19]

Farley

[11] 4,340,859

[45] Jul. 20, 1982

[54] MODULAR INCUBATOR CONTROL SYSTEM WITH SELF-TEST CAPABILITY

[75] Inventor: Max F. Farley, Marietta, Ohio

[73] Assignee: Mallinckrodt, Inc., St. Louis, Mo.

[21] Appl. No.: 141,275

[22] Filed: Apr. 18, 1980

[51] Int. Cl.³ .................... G01R 31/02; C12M 1/38
[52] U.S. Cl. ............................ 324/158 R; 119/37; 324/158 F
[58] Field of Search ........... 324/158 F, 158 P, 73 PC, 324/158 R; 119/35, 37; 128/1 B; 435/809

[56] References Cited

U.S. PATENT DOCUMENTS

| | | |
|---|---|---|
| 2,952,810 | 9/1960 | Helton. |
| 3,147,054 | 9/1964 | Alexander et al.. |
| 3,633,016 | 1/1972 | Walker et al.. |
| 3,723,867 | 3/1973 | Canarutto. |
| 3,755,888 | 9/1973 | Geil. |
| 3,808,532 | 4/1974 | Yuska ............................ 324/158 F |
| 3,870,953 | 3/1975 | Boatman et al.. |
| 3,904,861 | 9/1975 | McNamara ..................... 324/158 F |
| 3,953,797 | 4/1976 | Berard. |

Primary Examiner—Ernest F. Karlsen
Attorney, Agent, or Firm—Cushman, Darby & Cushman

[57] ABSTRACT

A laboratory incubator or similar electronically-controlled piece of hardware, is provided with at least one modular control unit, e.g. one for setting a desired relative humidity, and for indicating the actual relative humidity being attained within the laboratory incubator or similar device. The or each control module is provided with a normally hidden switch which may be changed by the user from its normal operating position, to each of several test positions, in which various items listed on a trouble shooting chart may be checked against the values actually indicated on the readout meter provided on that module. This leads to a determination by the user whether something is wrong with the module and it should be changed-out for salvage or repair, or if something is wrong off the module and in need of a part charge-out or a repair. Preferably the equipment is provided with a usually stowed extender board which may be taken from its stowage and temporarily plugged into the control box of the controlled device, between the control module in question and the place where that control module normally plugs into the control box, in order to make the "guts" of that module accessible and available for manipulation while it is being tested in a plugged-in condition. The extender board can be thought of as being an "extension cord" for the module that is being tested.

6 Claims, 31 Drawing Figures

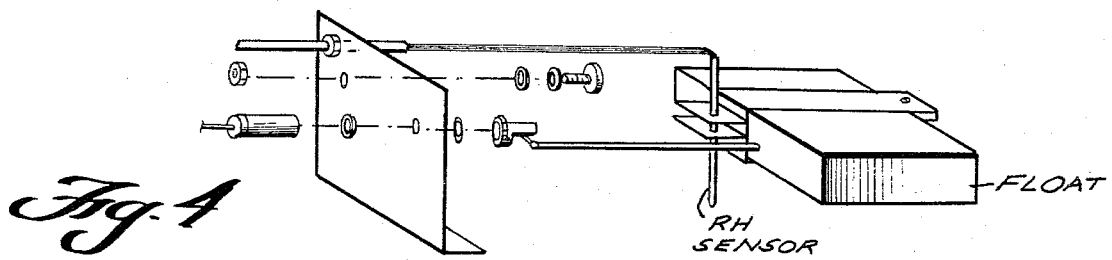
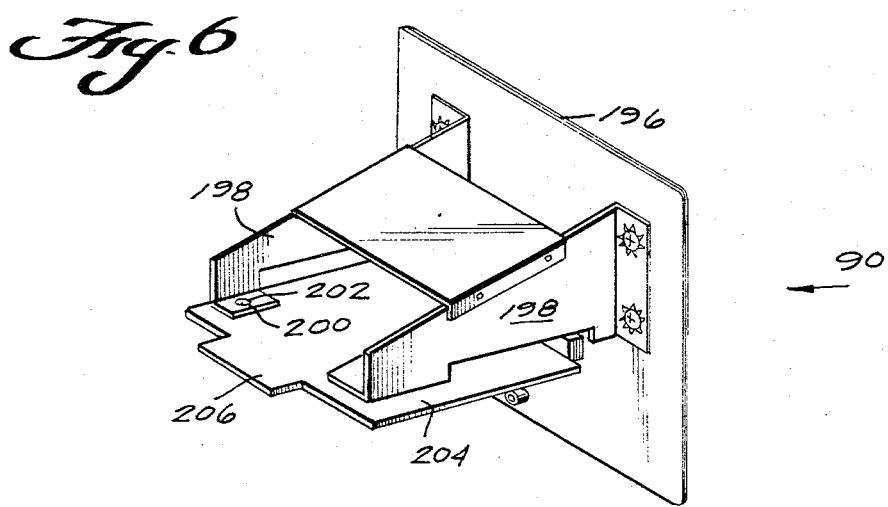
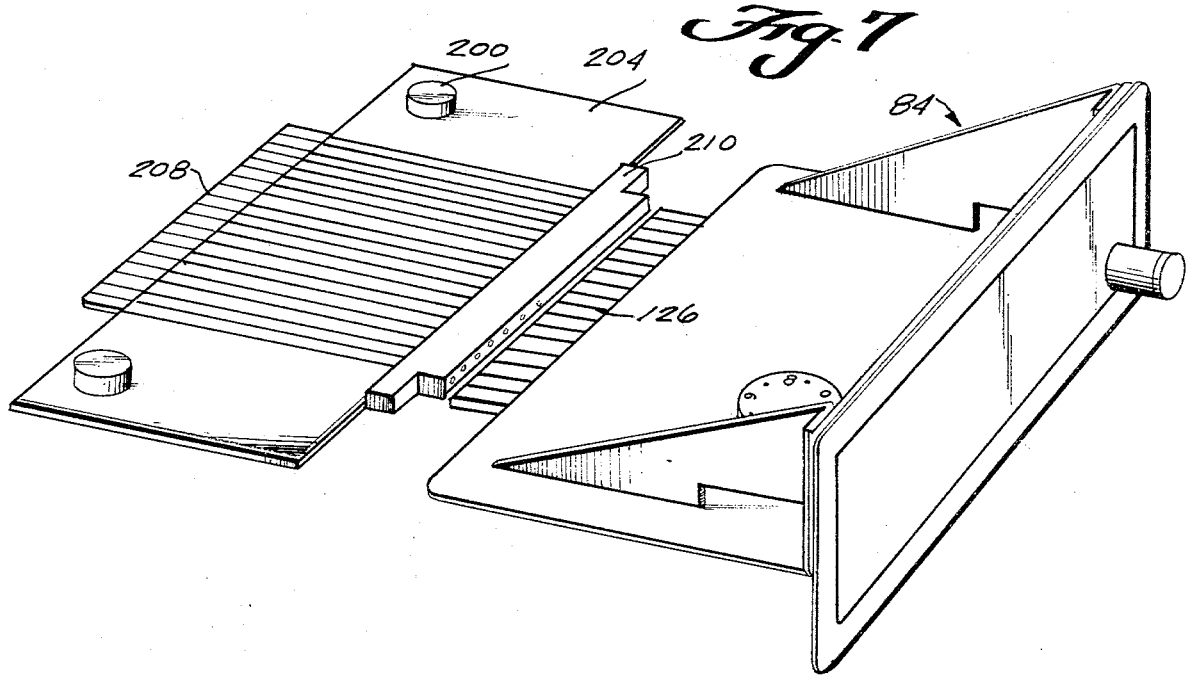

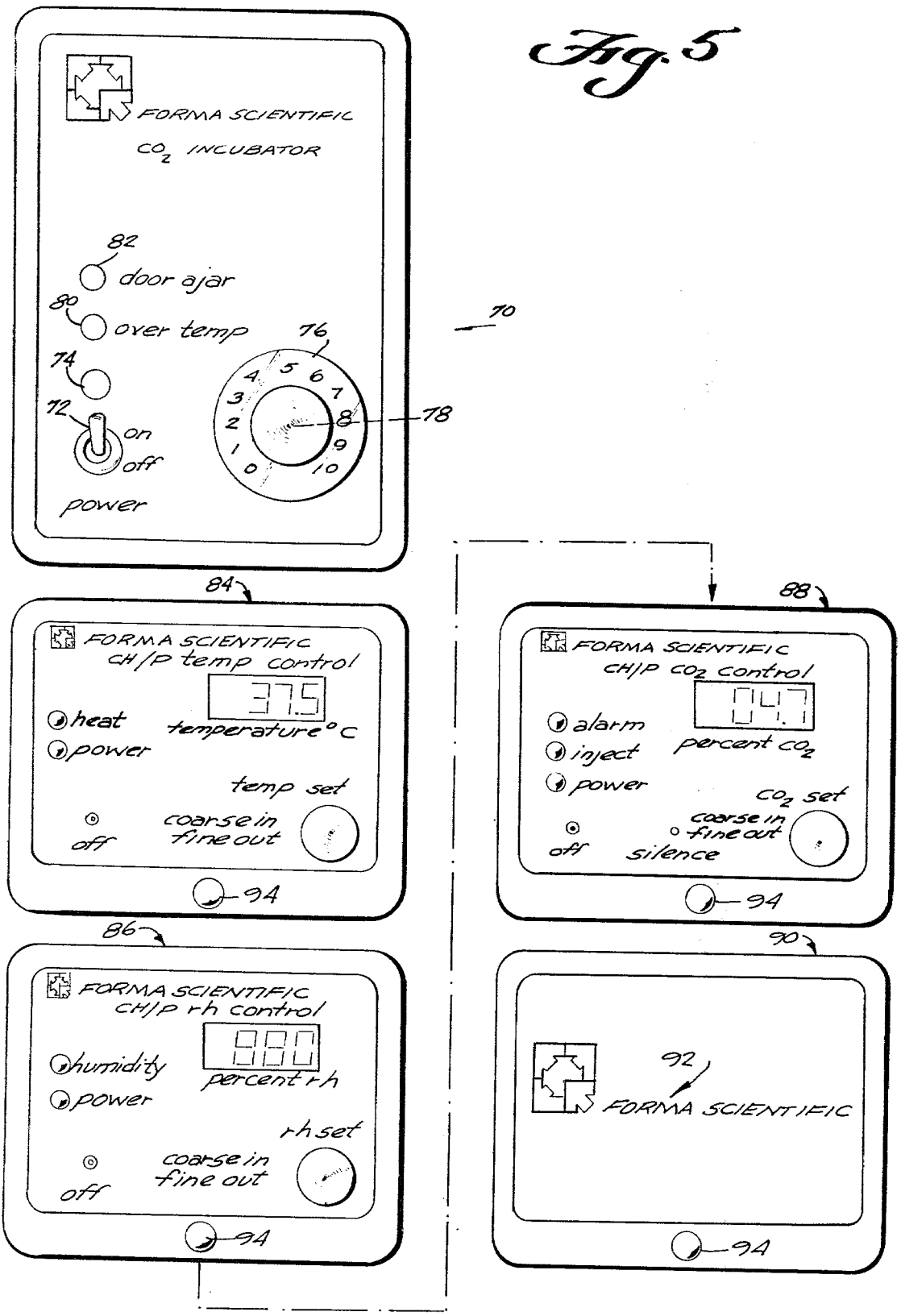

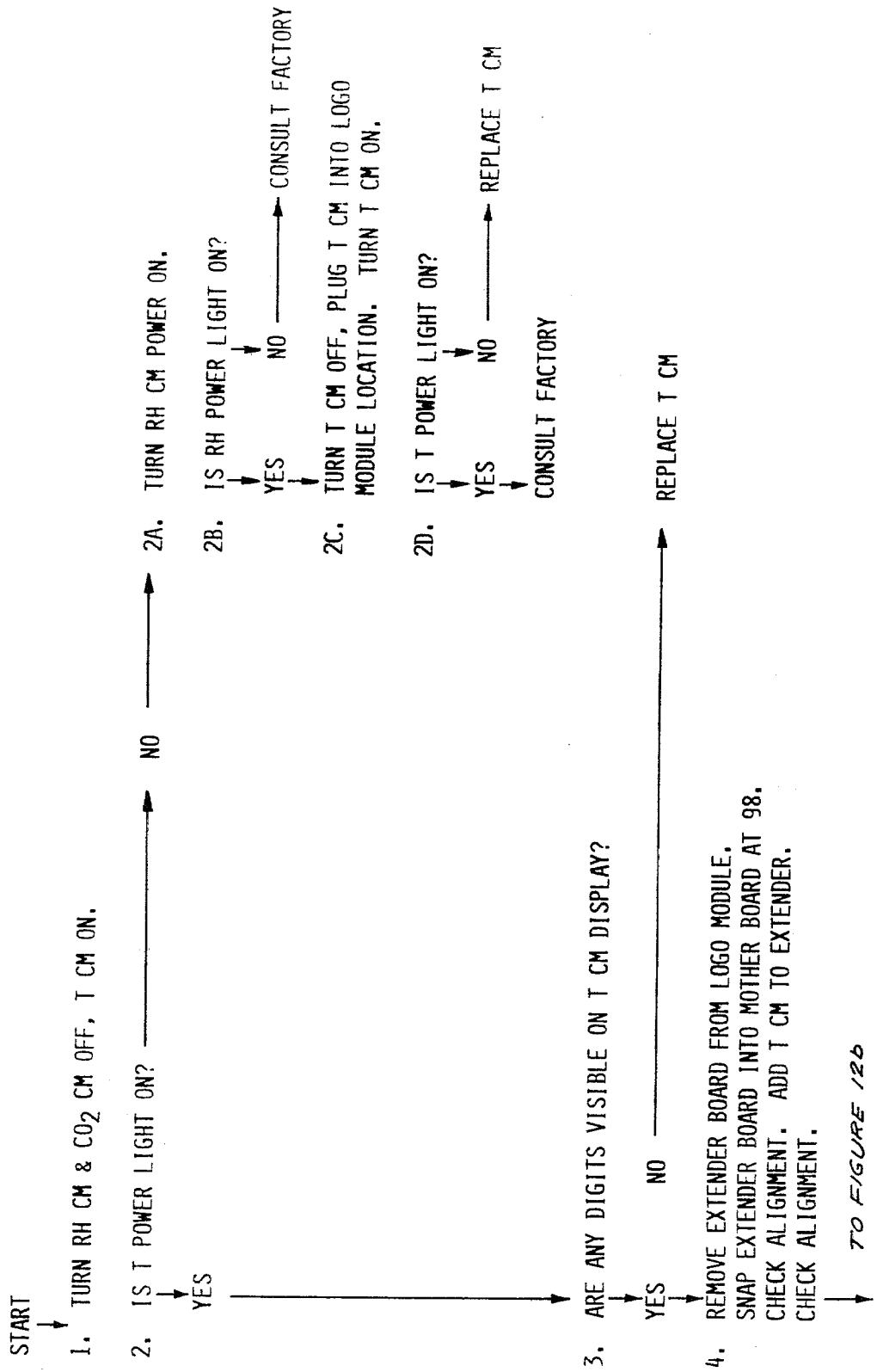

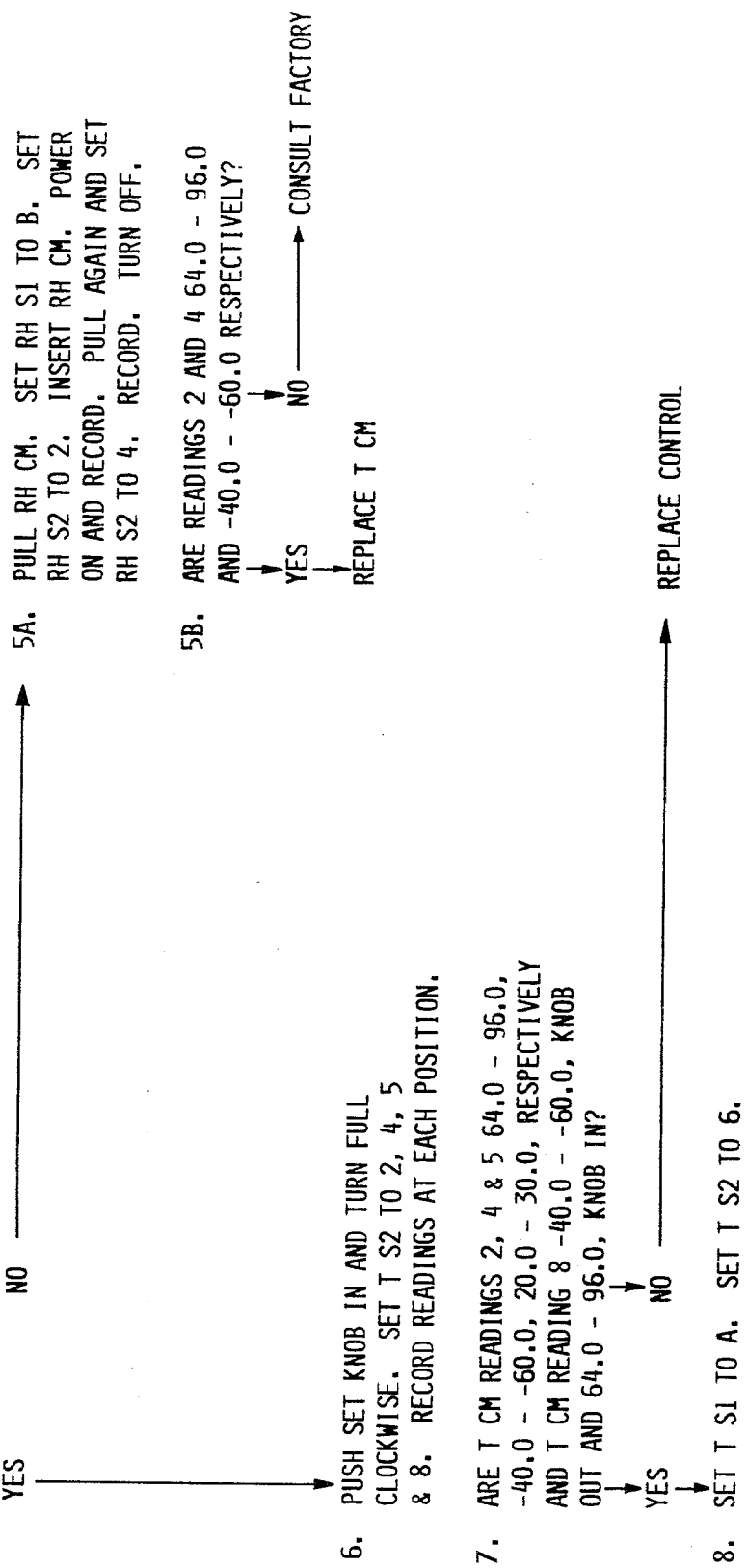

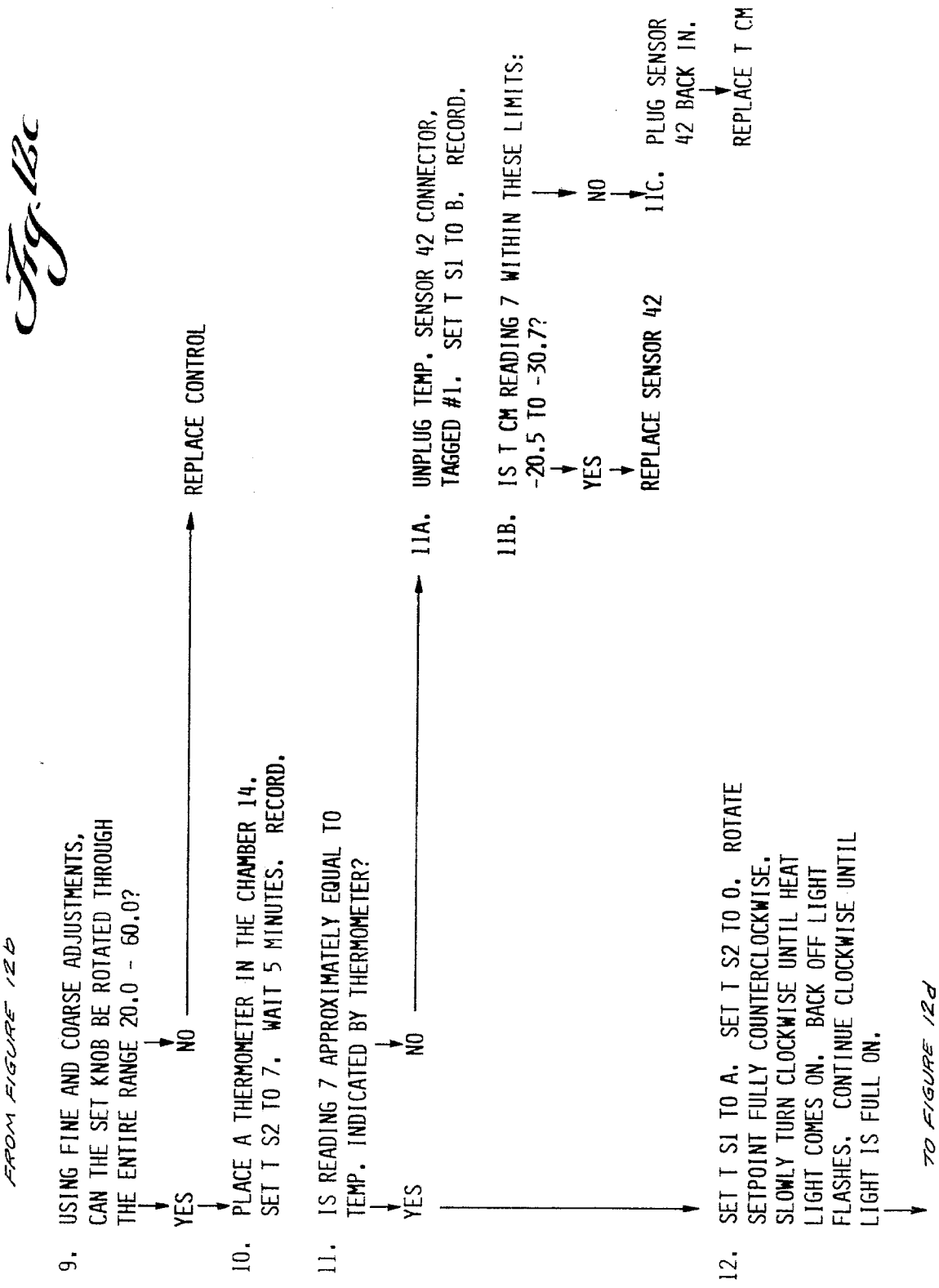

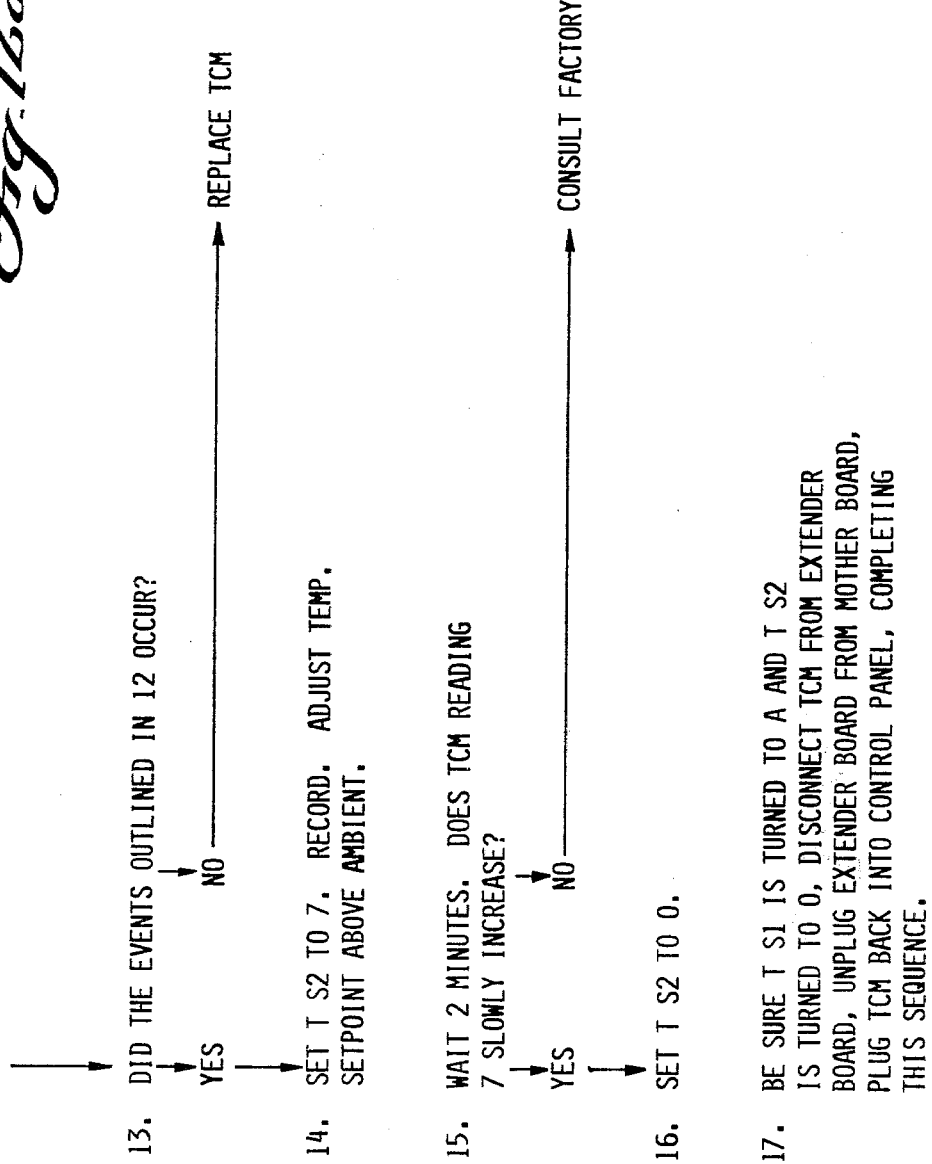

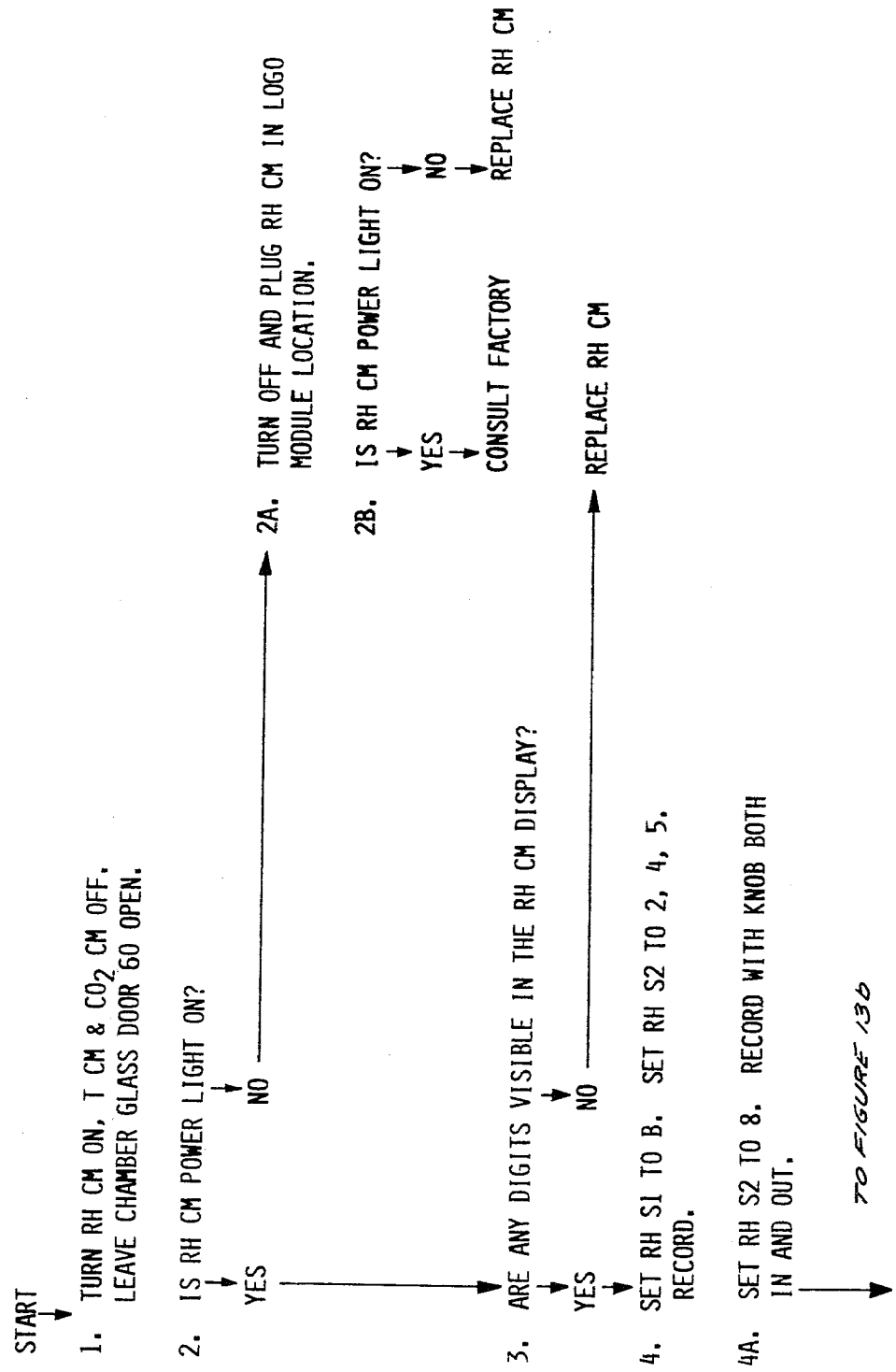

Fig. 13b

FROM FIGURE 13a

5. ARE READINGS 2, 4, 5, 8 (KNOB IN) AND 8 (KNOB OUT): 64.0 - 96.0, -40.0 - -60.0, 20.0 - 30.0, 64.0 - 96.0 AND -40.0 - -60.0, RESPECTIVELY.
 → YES → → NO → REPLACE CONTROL

6. SET RH S1 TO A. SET RH S2 TO 6.

7. CAN FINE AND COARSE ADJUSTMENTS BE ROTATED THRU RANGE 52.0 - 98.0?
 → YES → → NO → REPLACE CONTROL

8. PLACE A THERMOMETER IN WATER 50. WAIT 5 MINUTES.

8A. SET RH S2 TO 7. RECORD.

9. ARE THE VALUES OF READING 7 AND THERMOMETER APPROXIMATELY EQUAL?
 → YES → → NO →

9A. UNPLUG RH SENSOR 48. (PLUG #2 OF 48 ON MOTHER BOARD). SET RH S1 TO B.

TO FIGURE 13c

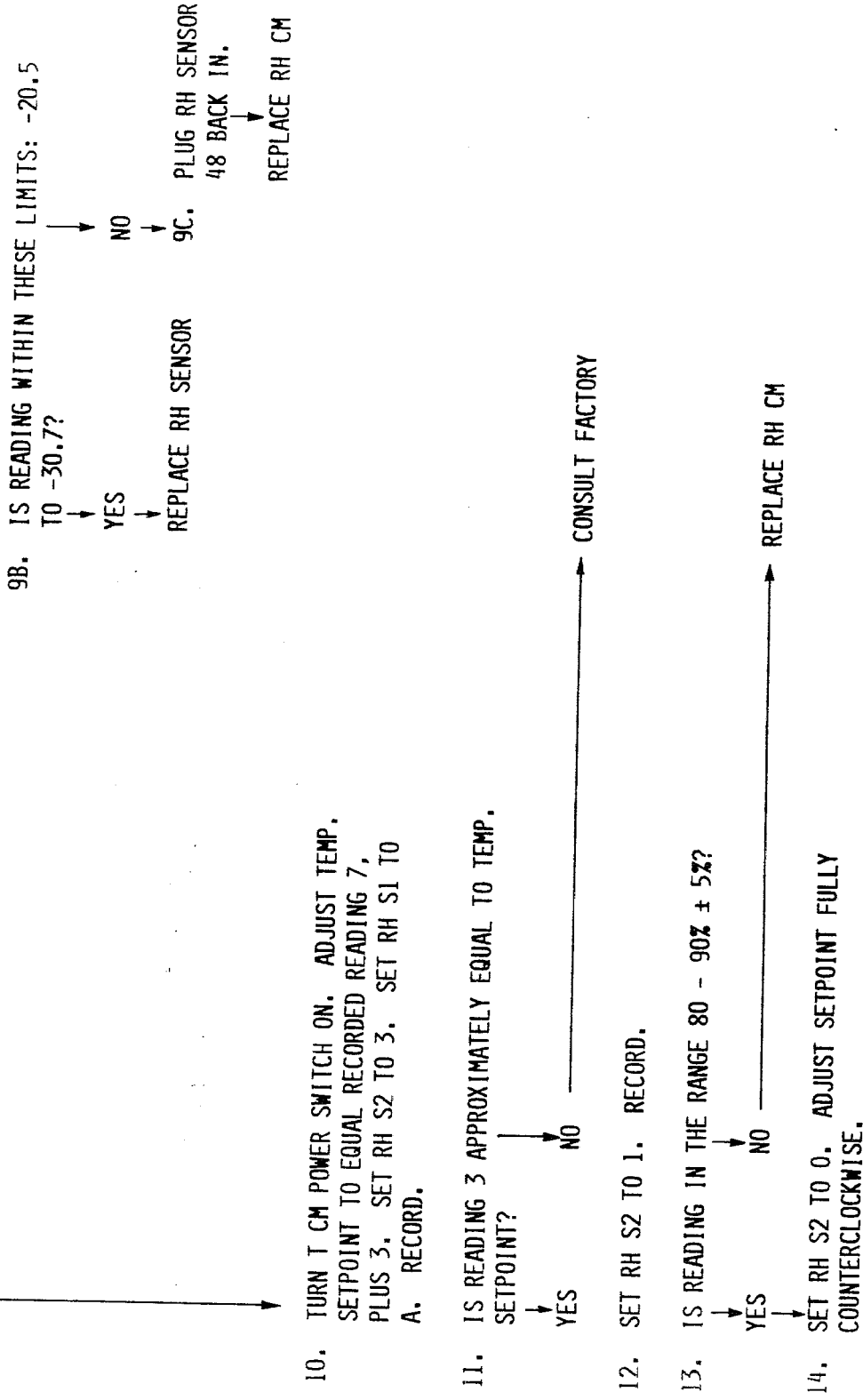

Fig. 13d

FROM FIGURE 13c

14A. TURN SET KNOB SLOWLY CLOCKWISE. RH LIGHT SHOULD FLASH AND THEN COME FULL ON.

15. DID THE EVENTS IN 14A. OCCUR?
    YES → 
    NO → REPLACE RH CM

16. CLOSE CHAMBER GLASS DOOR 60. SET RH S2 TO 7 AND RECORD READING.

16A. ADJUST RH SETPOINT FULLY CLOCKWISE.

17. DOES READING 7 INCREASE? IT SHOULD INCREASE AT LEAST 1°C IN 5 MINUTES.
    YES → 
    NO → CONSULT FACTORY

18. TURN T CM OFF.

19. BE SURE RH S1 IS TURNED TO A AND RH S2 IS TURNED TO 0, DISCONNECT RH CM FROM EXTENDER BOARD, UNPLUG EXTENDER BOARD FROM MOTHER BOARD, PLUG RH CM BACK INTO CONTROL PANEL, COMPLETING THIS SEQUENCE.

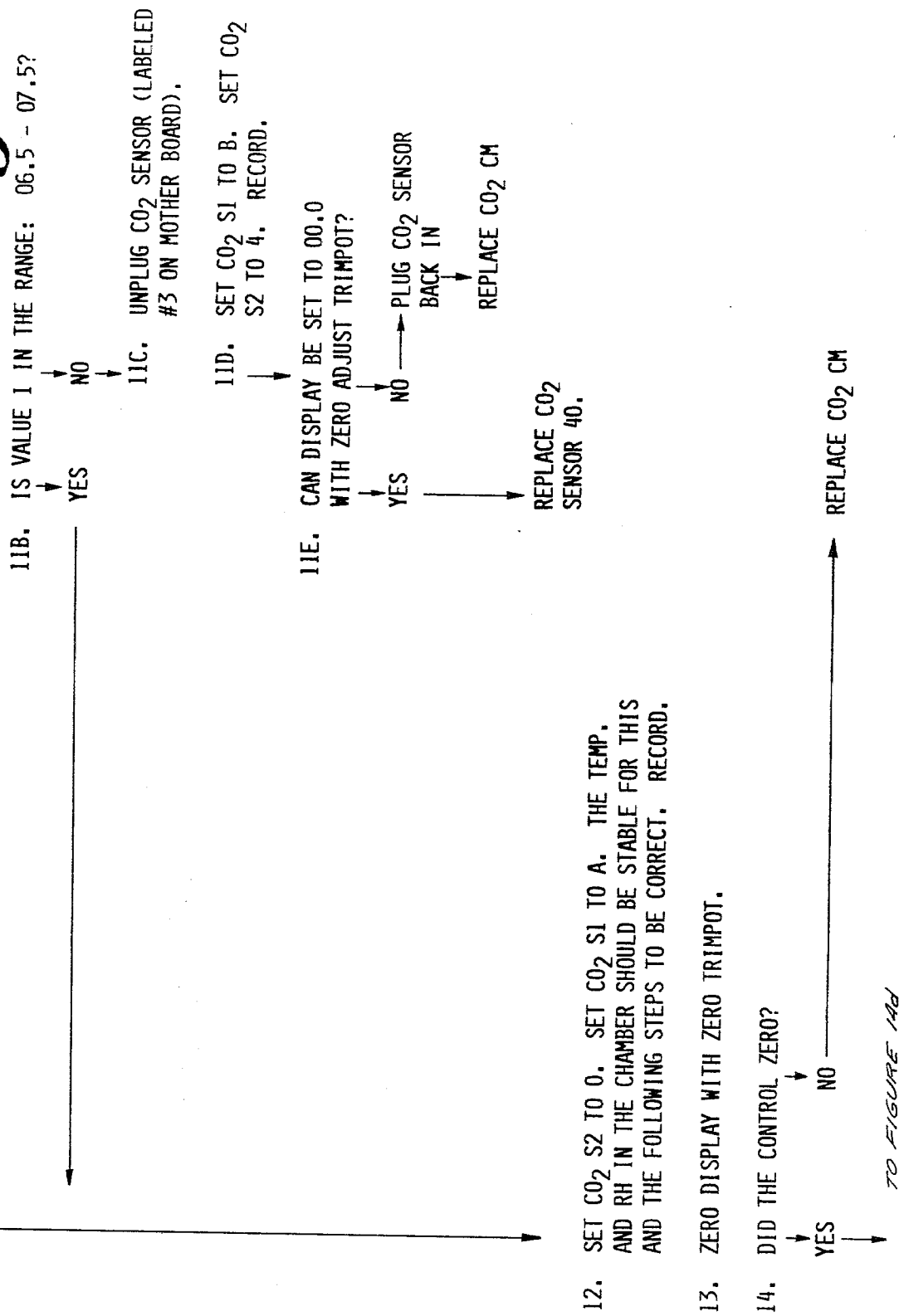

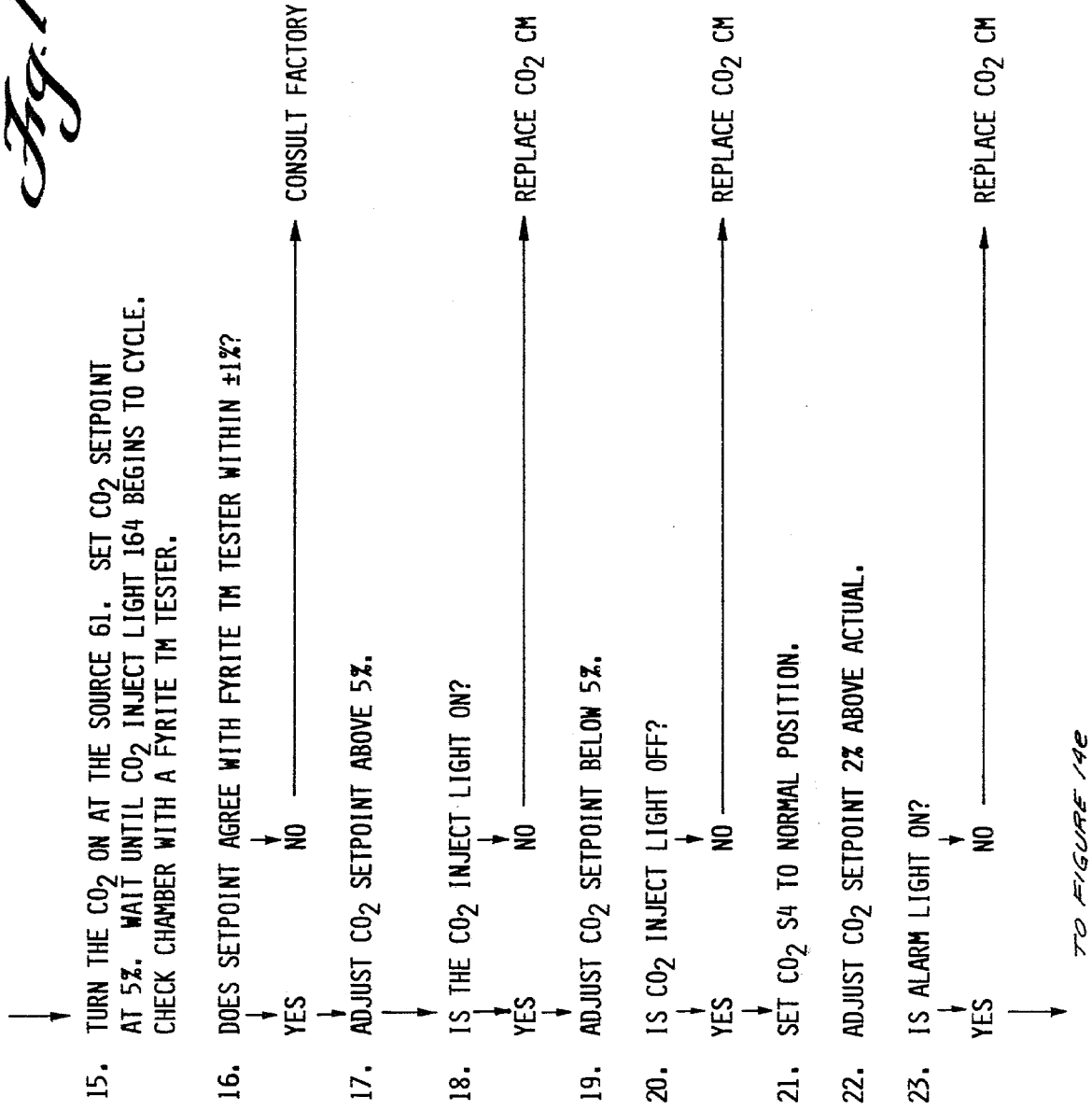

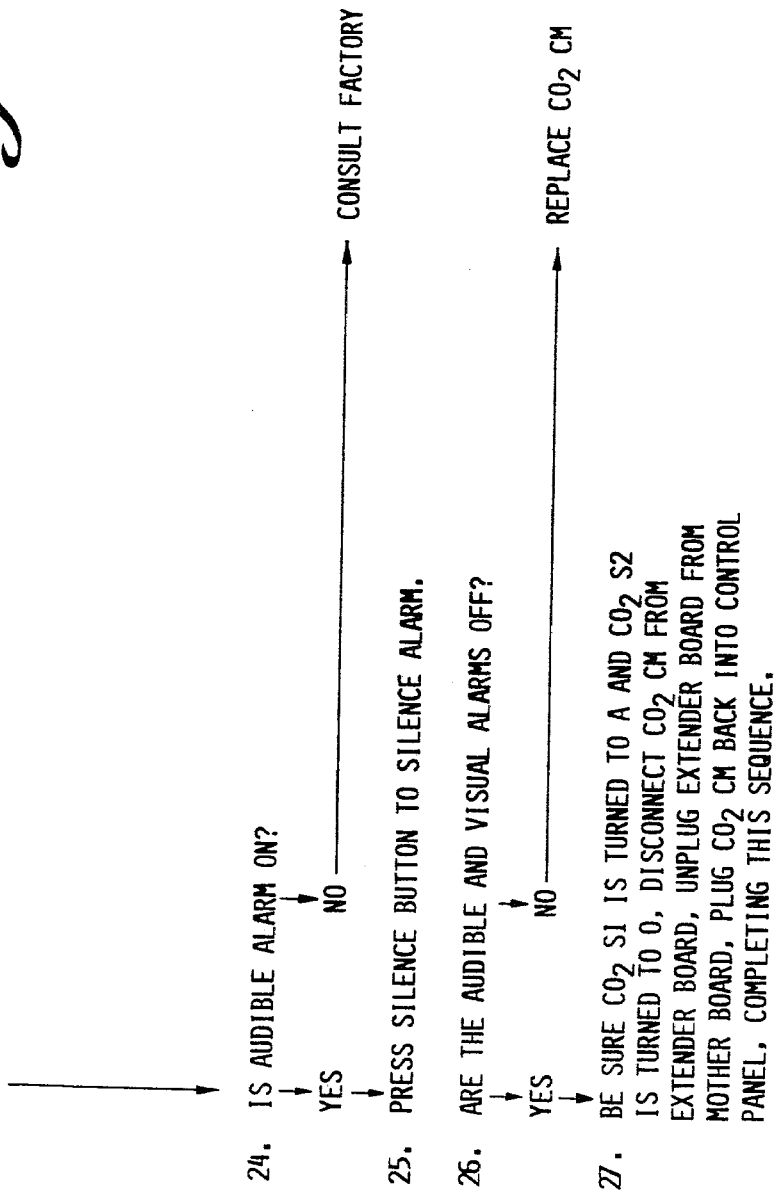

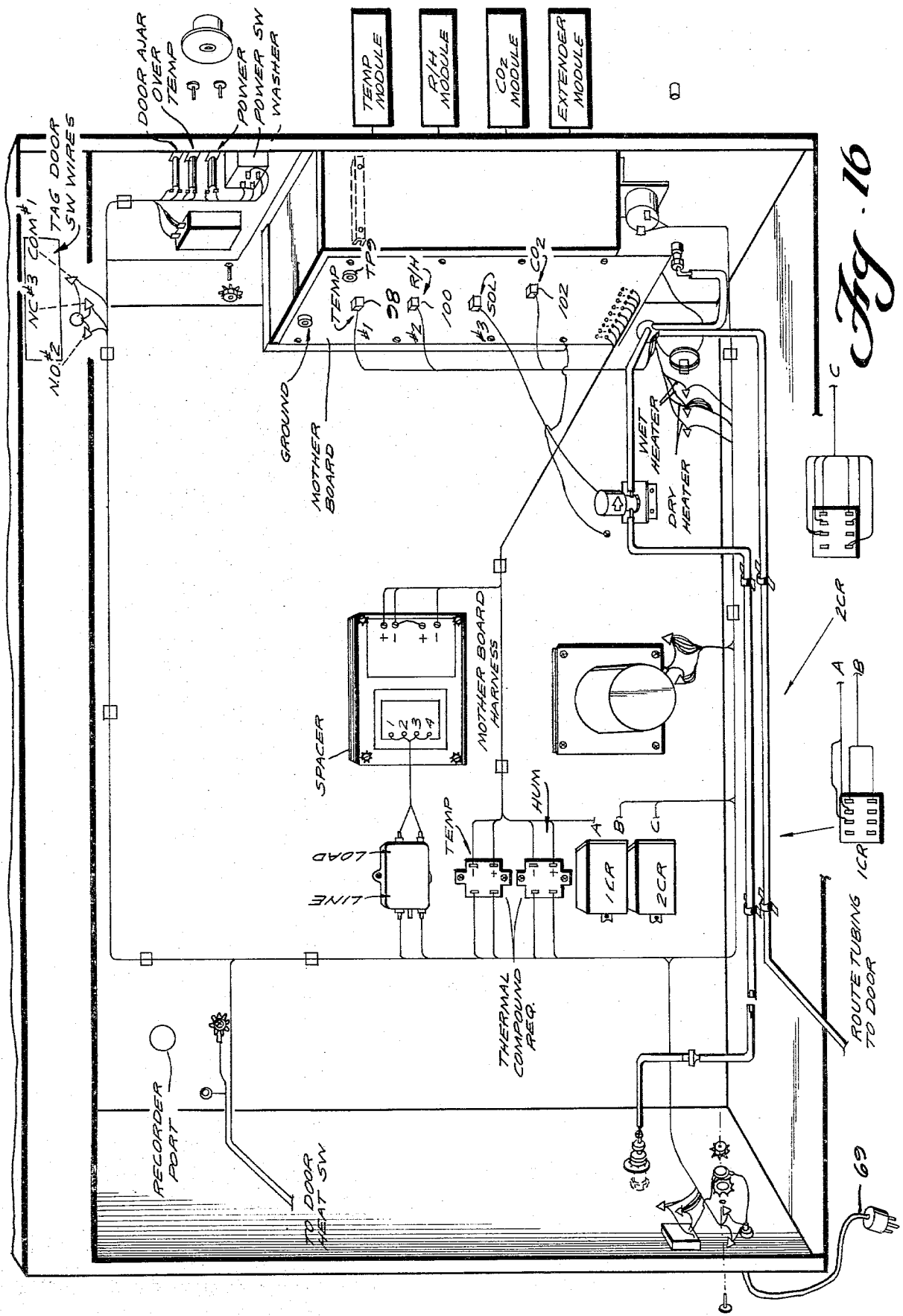

TO FIGURE 17b →

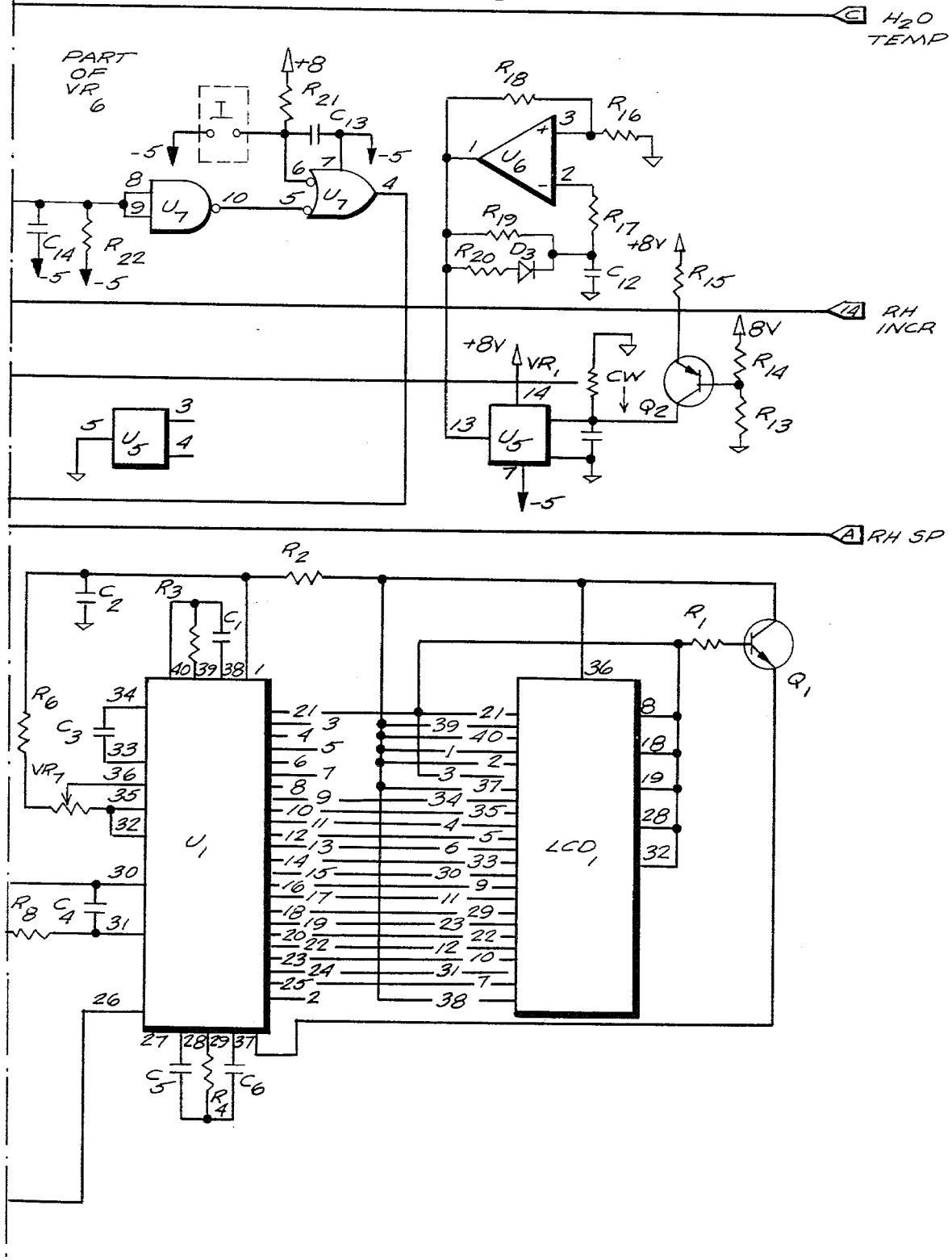

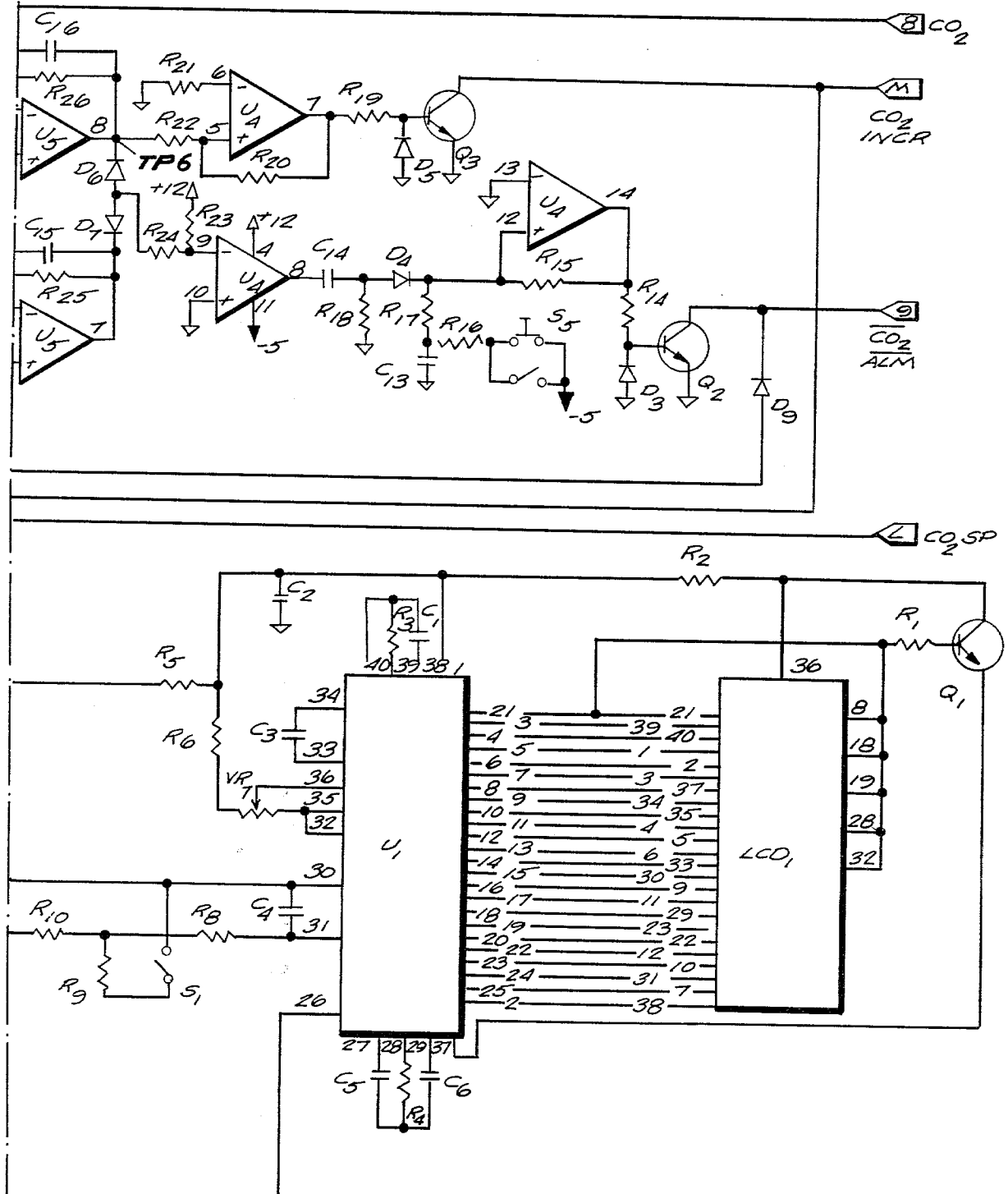

MODULAR INCUBATOR CONTROL SYSTEM WITH SELF-TEST CAPABILITY

BACKGROUND OF THE INVENTION

It has become common to provide sophisticated electronically-controlled equipment, which is going to be used by highly-capable, easily-instructed users, with the technological means to determine what is wrong when the users sense that the equipment is not operating properly.

The user determination can be the first step in quickly overcoming an equipment malfunction so the user's work may proceed with scarcely a ripple.

A place one may see this technique used to great advantage is with modern xerographic photocopying machines, where, when some malfunction or matter needing remedial attention develops, the machine ceases producing copies, and in its L.E.D. display which normally visibly tallies the copies being made, a code appears. Upon consulting a chart provided with the copier, the user may equate the code to a particular act of repair or remedial procedure which is to be conducted.

Many of these acts and procedures are ones which may be executed on the spot by the normal, highly-capable user of the copies. Thus, the machine may be returned to service by the user after only a few moments of "down" time, and a service call to the manufacturer or service supplier of the machine is avoided. This makes life much easier for both the user of the machine and the manufacturer or service supplier. Even if the user is not equipped to make the indicated repair, he or she often is enabled to indicate when placing a service call exactly what the machine indicates is its problem.

SUMMARY OF THE INVENTION

It is an object of the present invention to adapt the above-explained concept to laboratory incubators and the like, and to advance the concept further in at least two other dimensions. Firstly, to make some of the controls in modular form, and to provide each with a switch which may be changed by the user from its normal operating position, to each of several test positions, in which various items listed on the trouble shooting chart may be checked against the values actually indicated on the read-out meter provided on that module. This leads to a determination by the user whether something is wrong with the module and it should be changed-out for salvage or repair, or if something is wrong off the module and in need of a part change-out or a repair. Secondly, the concept is advanced in the direction of providing a preferably conveniently stowed extender board which may be temporarily plugged into the control box of the controlled device, between the control module in question and the place where that control module normally plugs into the control box, in order to make the "guts" of that module accessible and available for manipulation while it is being tested in a plugged-in condition. The extender board can be thought of as being an "extension cord" for the module that is being tested.

The principles of the invention will be further discussed with reference to the drawings wherein a preferred embodiment is shown. The specifics illustrated in the drawings are intended to exemplify, rather than limit, aspects of the invention as defined in the claims.

BRIEF DESCRIPTION OF THE DRAWINGS

In the drawings

FIG. 4 is a larger scale exploded perspective view of the relative humidity sensor and water reservoir automatic water level control.

FIG. 5 is a fragmentary front elevation view of the laboratory incubator, showing the three control module units and the logo module which acts as a storage site for the extender board.

FIG. 6 is a rear perspective view of the logo module, showing the extender board stowed (in full lines) and removed (in phantom lines).

FIG. 7 is a fragmentary exploded perspective view from above, showing how the extender board is interposed between a modular control unit and the place where that modular control unit normally plugs into the control box of the controlled hardware device.

FIGS. 12, 13 and 14 are respective self-test trouble shooting charts for the modular control units of FIGS. 9, 10 and 11.

FIG. 16 is a somewhat schematic wiring diagram as seen through the aperture of the removed left side maintenance door of the laboratory incubator.

DETAILED DESCRIPTION

Figure 1:
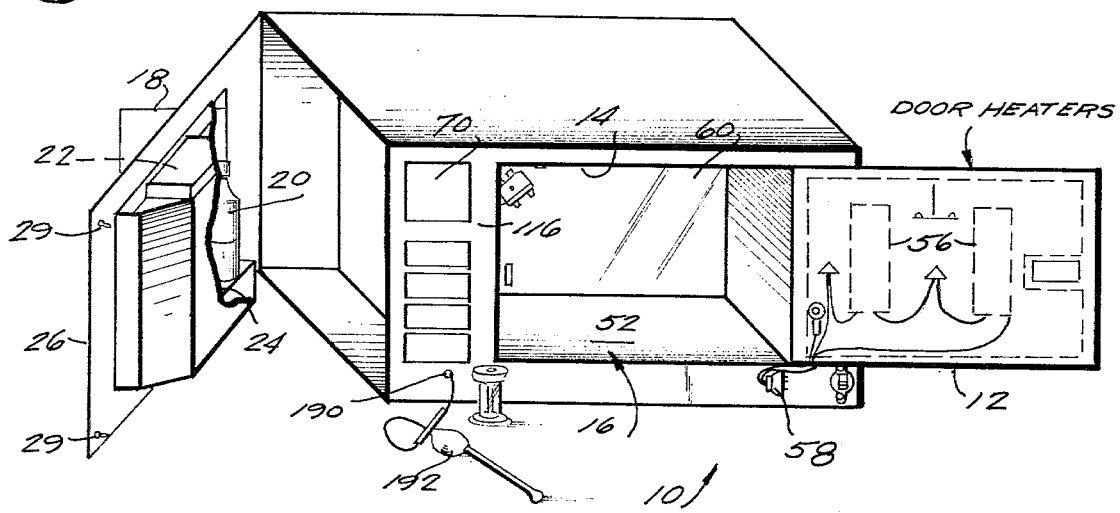
FIG. 1 is a perspective view of a laboratory incubator provided with modular controls with self-test capabilities in accordance with principles of the present invention. In this view, the front door to the incubator chamber is shown being open as is the left side maintenance door. The conventional removable racks or shelving are simply omitted in this view.
Figure 2:
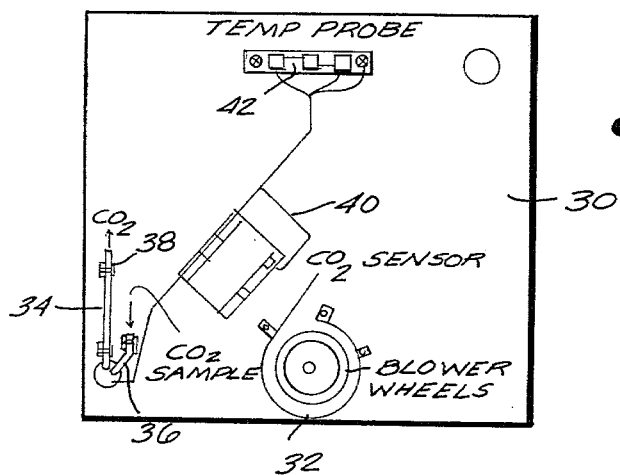
FIG. 2 is an interior elevation view of the left side of the incubator chamber.
Figure 3:
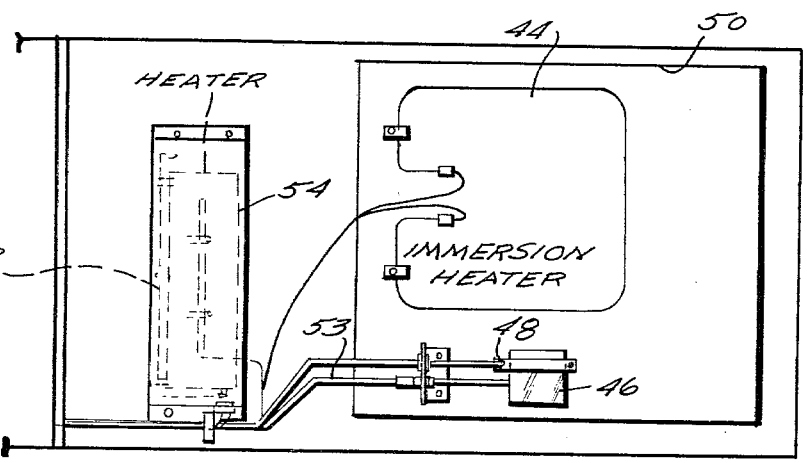
FIG. 3 is an interior plan view of the bottom of the incubator chamber, with the chamber floor panel removed.
Figure 8:
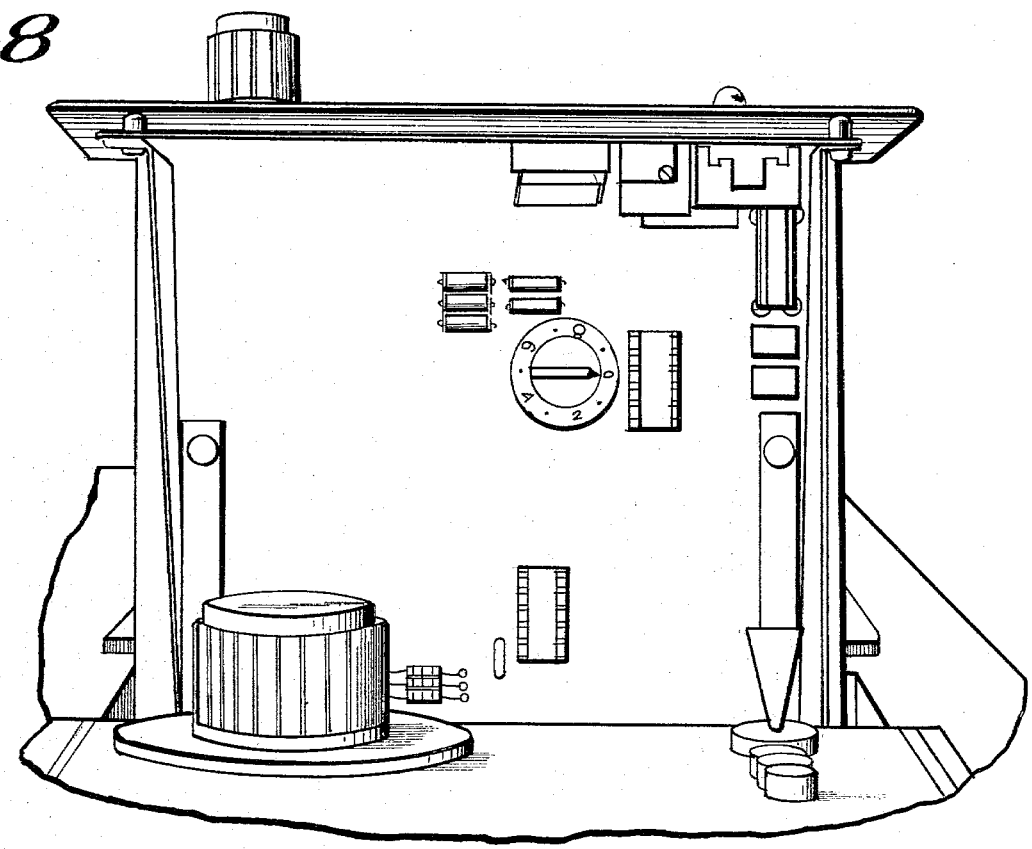
FIG. 8 is a perspective view from above showing a modular control unit in the course of being self-tested.

The laboratory incubator 10 is shown having a door 12 on the front, permitting physical access to an interior chamber 14. Normally, the chamber 14 is provided with a removable rack and shelf assembly (not shown) so that a number of laboratory specimen containers may be supported and kept within the controlled environment of the interior chamber 14. These, as well as the chamber floor panel 16 may be removed for cleaning, disinfecting and/or sterilization when necessary.

On the left side another access door 18 is provided; it does not provide access to the chamber 14. Rather, it provides access to the humidity reservoir fill bottle 20 and to the door heater control 22. Also on the left side and containing the humidity reservoir control bottle compartment 24 is a larger maintenance door 26 which, when opened, provides physical access to the rear of the control panel 28 and to various wiring and plumbing elements to permit easy set-up and repair. All the high voltage circuitry is kept safely out of the way behind this door. It is a rare occasion when this door needs to be opened, so it is kept closed, e.g. by two-permanently-attached screw fasteners 29.

The preferred sites of various other features of interest will now be pointed out.

On the left wall 30 of the incubator chamber 14 is shown provided a blower 32 for establishing and maintaining a controlled lateral flow of internal atmosphere within the chamber (when used in connection with solid shelving and chamber walls having appropriate duct work, not shown). Also on the left wall 30 are a $CO_2$ sampler 34 having an inlet 36 and an outlet 38, a $CO_2$ sensor 40 and a temperature probe 42.

At the bottom of the chamber are an immersion heater 44, a float valve 46 and a relative humidity sensor 48; all these are in a well-like water reservoir 50 that is normally covered by a removable floor panel 52. The humidity reservoir fill bottle 20 in compartment 24 is connected to the float valve 46 by tubing 53.

Also at the bottom of the chamber, but not in the water reservoir 50 is a dry heater 54, e.g. provided with a glass tape heater wire.

The outer front door 12 is provided with door heaters 56 which plug into the wiring of the incubator chassis at 58. In most cases the door heaters are only occassionally used; their purpose is to drive off condensation that otherwise would obscure viewing through the inner, independently openable transparent, e.g. glass door 60.

A $CO_2$ inlet fitting 61 is provided on the back of the chassis at 62 and piped as at 64 to the solenoid control valve 66 to the inlet 36 and to a $CO_2$ sample port 68 provided at the foot of control panel 28.

The main electrical plug for the device 10 is provided on the chassis back at 69.

Starting at the top, the control panel is seen to have a built-in main section 70 which includes a power on-off switch 72, a power-on indicator light 74, a hand set dial 76 for an independent over-temperature safety thermostat 78 for protecting the incubator and its contents, an over-temperature indicator light 80 and a door-ajar indicator light 82.

Below the main section 70 are ranked four independently removably plugged-in control module units, these being a temperature control module 84, a relative humidity control module 86, a $CO_2$ control module 88 and a dummy module 90 that, e.g. bears the manufacturer's logo 92 on its front side and removably mounts the extender board (FIG. 6) on its back side.

Each modular unit 84, 86, 88, 90 may be completely disinstalled simply by pulling out on the handle portion of the poppet bead-like fastener 94 shown near its lower edge. Of course, if the incubator is in operation, each working module 84, 86 or 88 should be turned-off using the appropriate switch on its face plate before any attempt is made to disinstall it.

At the back of the control panel 28 is provided a mother board 96 which incorporates intermediate portions of wiring as indicated, and provides plug-in receptacles 98, 100, 102 for the modules 84, 86, 88, respectively.

Figure 9:
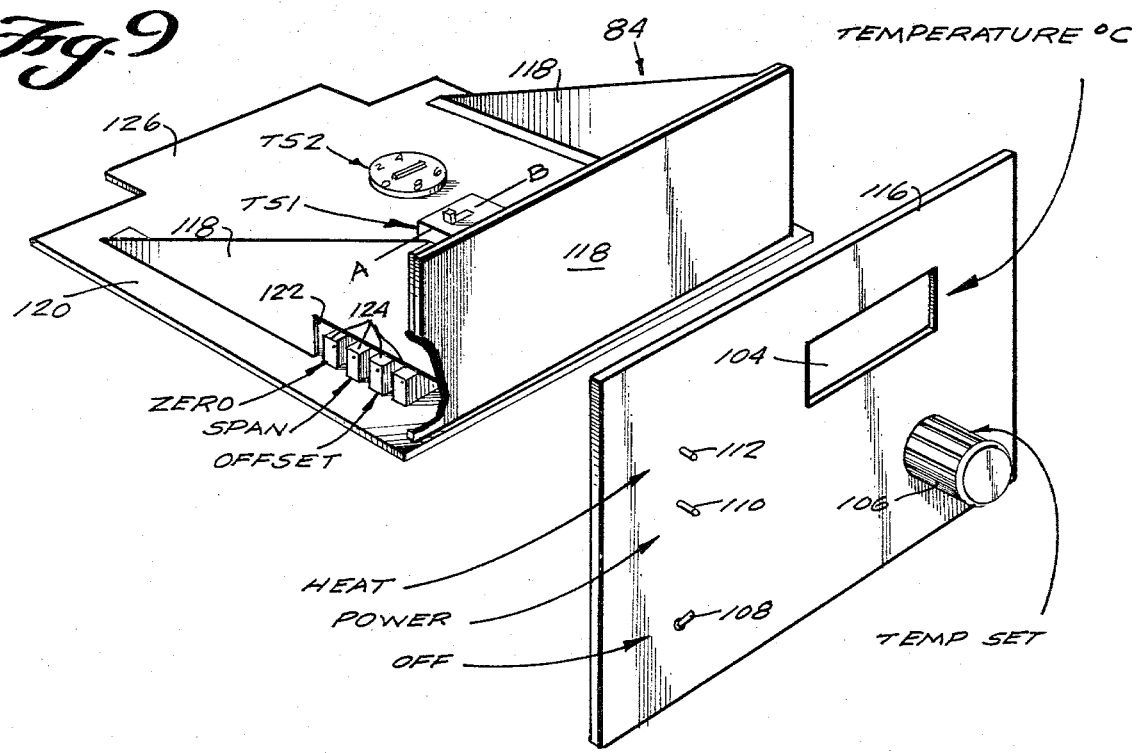
FIGS. 9, 10 and 11 are similar, simplified, exploded perspective views of three of the modular control units, respectively for temperature, relative humidity and carbon dioxide control. On these views most details are omitted, except for the parts which need to be manipulated while conducting the respective self-test procedures.
Figure 10:
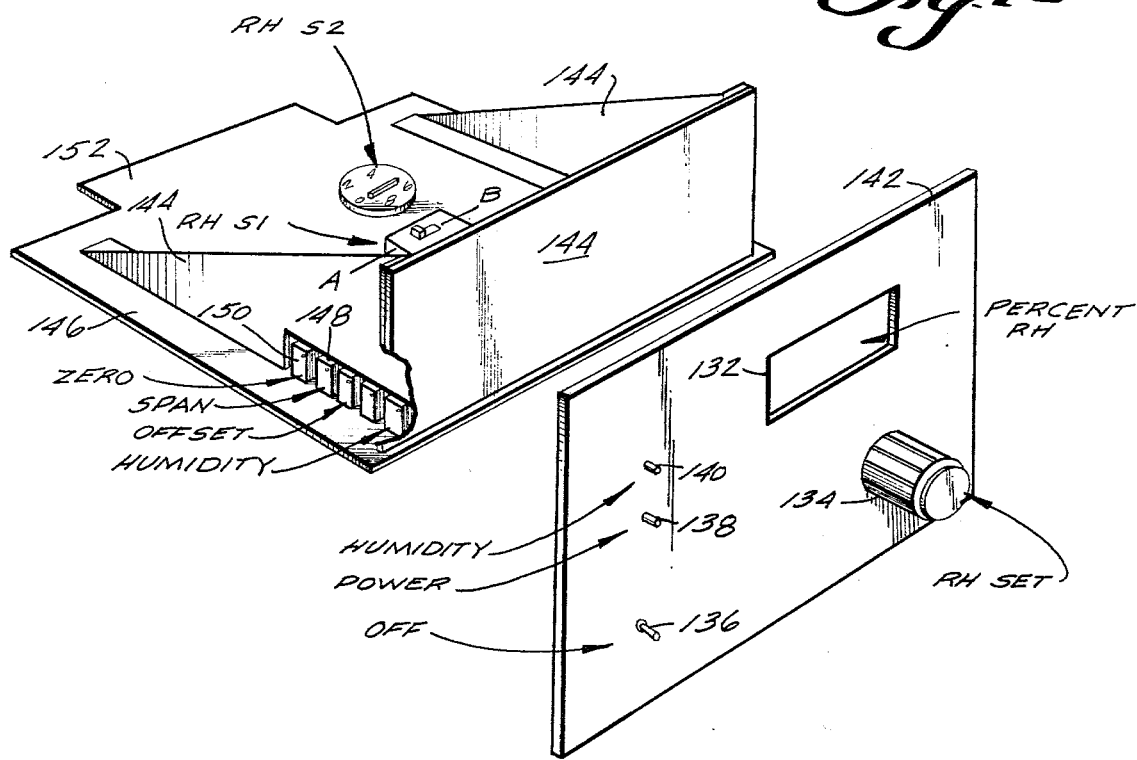
Figure 11:
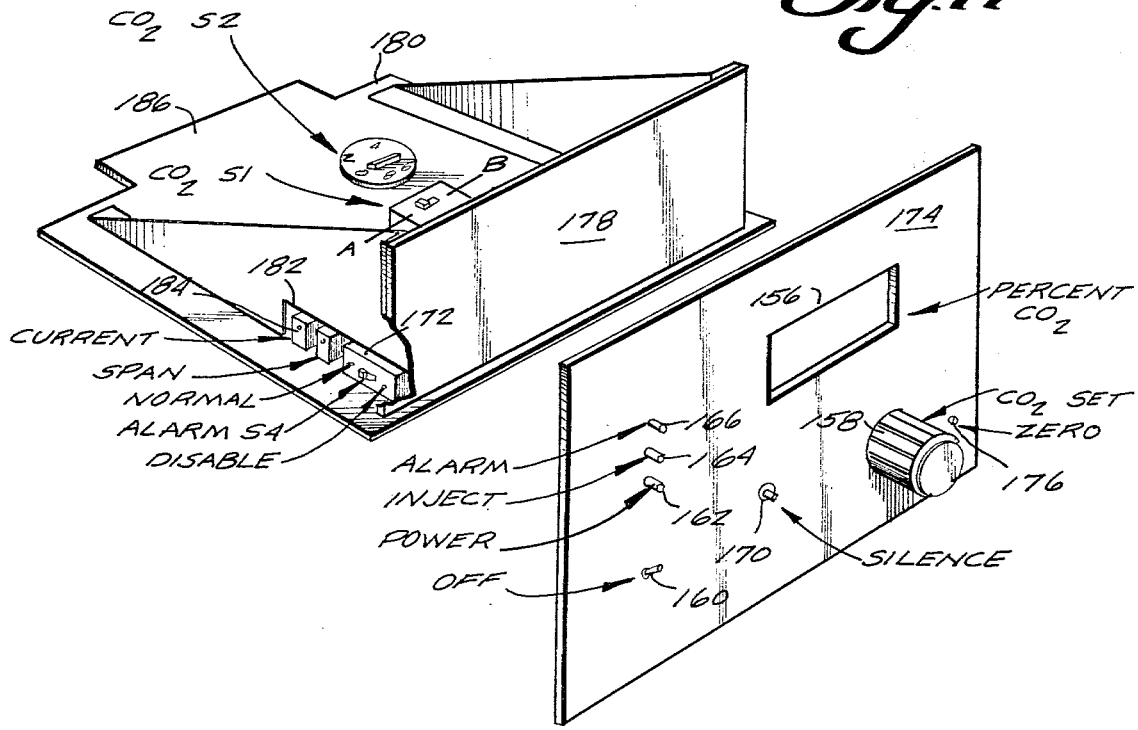

Now with reference to FIGS. 9, 10 and 11 some of the basic variable control elements of the respective modules 84, 86, and 88 will be outlined in more detail. In each of these figures the faceplate of the module is shown exploded away from the rest of the module. (In fact it is not removable like this in normal use, but is merely shown exploded away from the remainder in this view so as to permit you to see both what is on the faceplate and what is on the rest of the module without having the one obscure the other.)

FIG. 9 shows the temperature ("T") control module 84. It incorporates a voltmeter with an L.E.D. digital readout at 104. Normally this readout window displays the actual temperature within the incubator chamber as sensed by the temperature probe 42. However, if the knob 106 of the temperature set control is momentarily pushed-in, the digital readout window 104 will display the temperature to which this control is set. The setpoint may be changed by rotating the control knob 106. While the control knob 106 is in a manually pushed-in condition, and for about twenty seconds thereafter, the set point temperature will be displayed in the readout window 104. After about twenty seconds following release, the readout window 104 will revert to displaying the actually sensed temperature.

Element 108 is an on/off switch for the temperature control module. When this switch is "on", the power indicator light 110 will remain lit. When the setpoint temperature lies above the temperature being sensed, all or some of the heaters will be in operation and the heating indicator light 112 will remain lit.

In normal operation, the faceplate 114 of the temperature control module 84 is flush with the control panel face plate 116 of the chassis of the incubator 10, so that the rest of what is shown in FIG. 9 is out of sight and inaccessible. Back of the module faceplate 114 is a mechanical structure 118 which mounts a low voltage electronic circuit board 120 with a number of circuitry components provided on it. Conspicuous among these are test switch T S1, which is shown having positions A and B, test switch T S2, which is shown having positions 0 through 9, and, accessible at the front left through a slot 122 in the respective mechanical wing-like bracket structure 118 are voltmeter readout alignment screws 124 respectively (rear to front) for zero, span, offset and (undesignated).

Projecting laterally rearwardly at the rear edge of the low voltage electronic circuit board 120 is a tab 126 bearing a row of individual electrical connector contacts 128 which lead to and from the various circuitry elements on the board 120.

When the incubator 10 is in normal use, the switch T S1 is in position A, the switch T S2 is in position 0 and the tab 126 is plugged into the receptacle 98.

Figure 15:
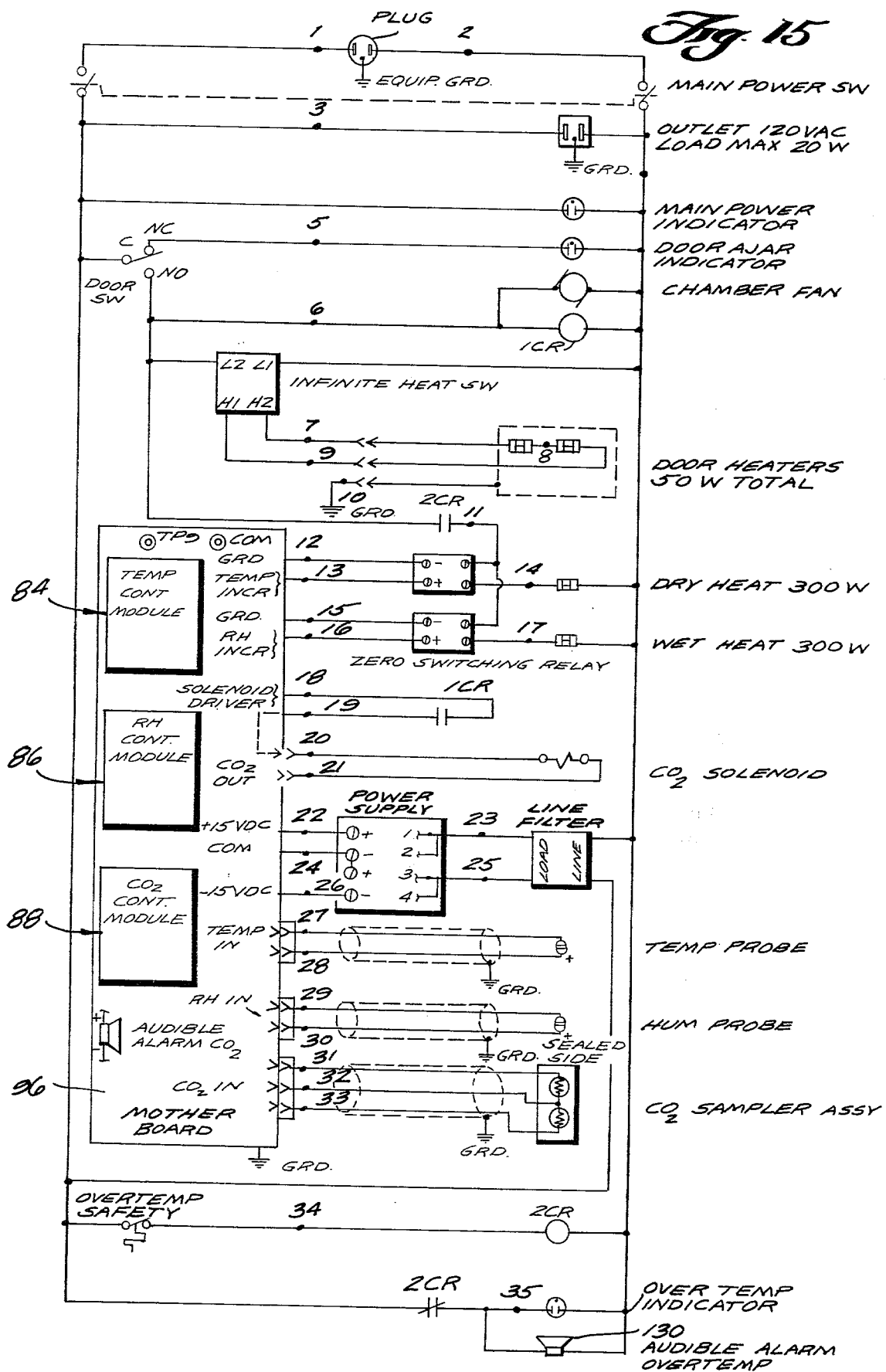
FIG. 15 is a typical general electrical circuitry schematic diagram of the laboratory incubator.
Figure 17A:
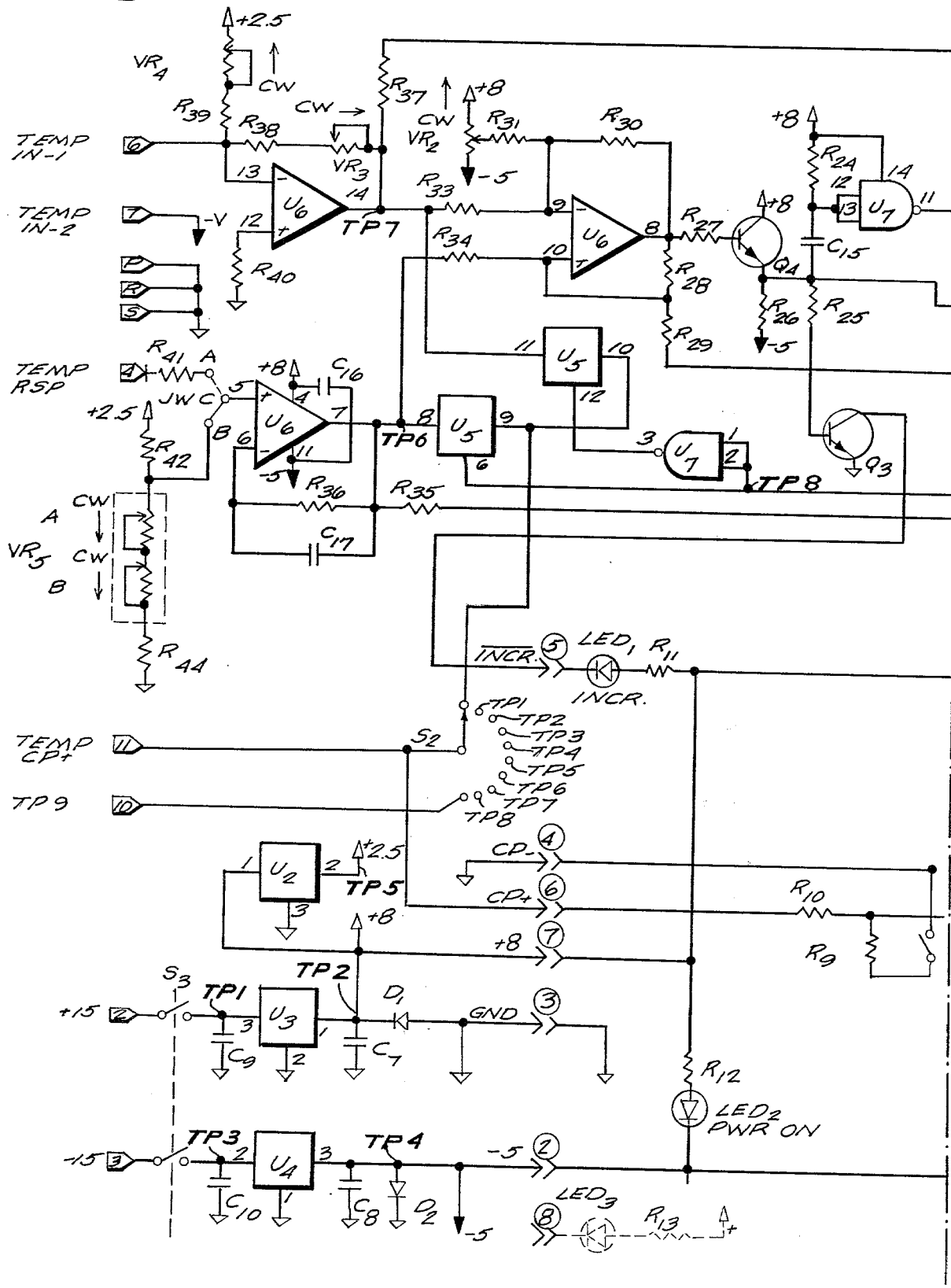
FIGS. 17, 18 and 19 are respective electrical circuitry schematic diagrams of the temperature, relative humidity and carbon dioxide control modules of the laboratory incubator.
Figure 17B:
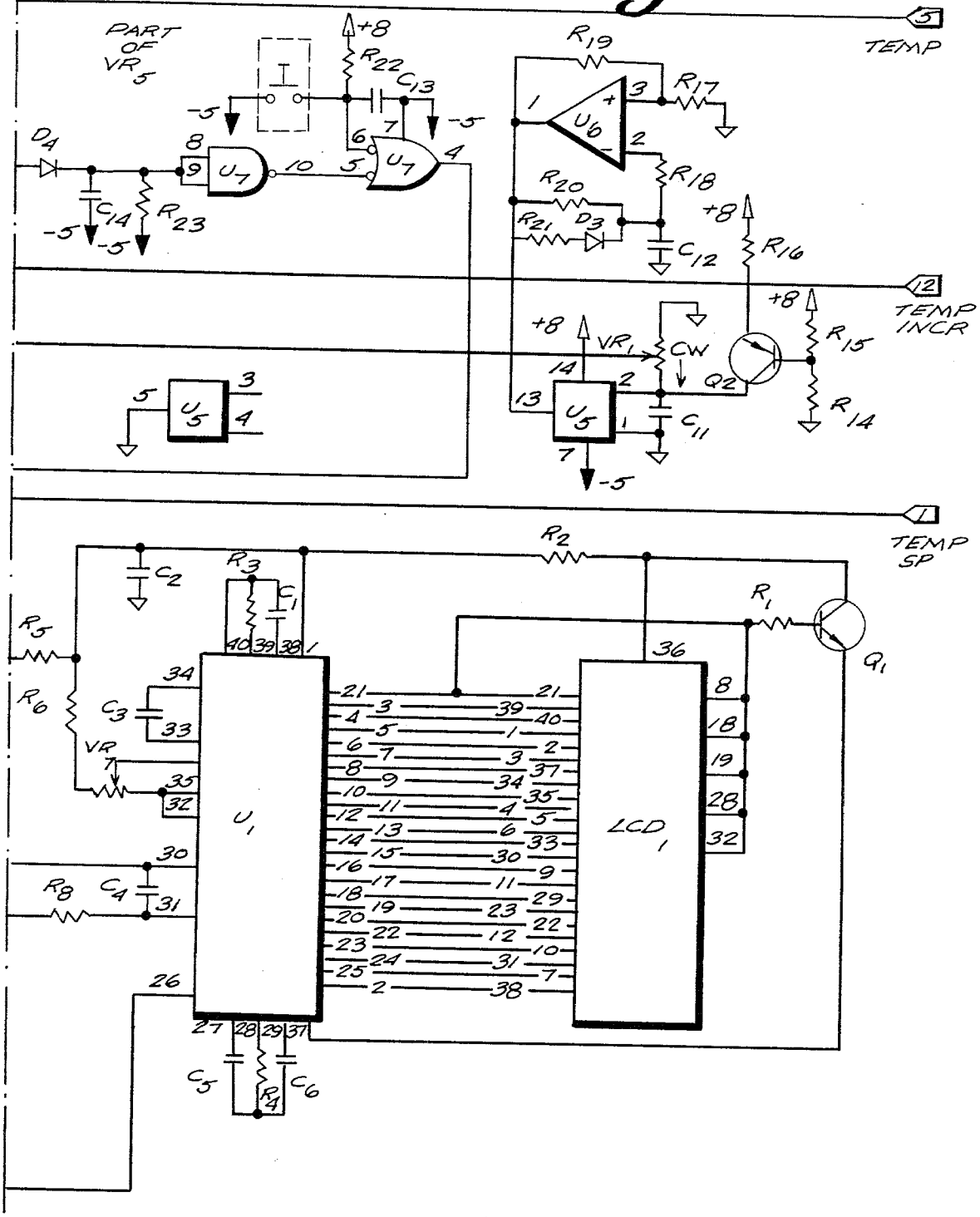
Figure 18A:
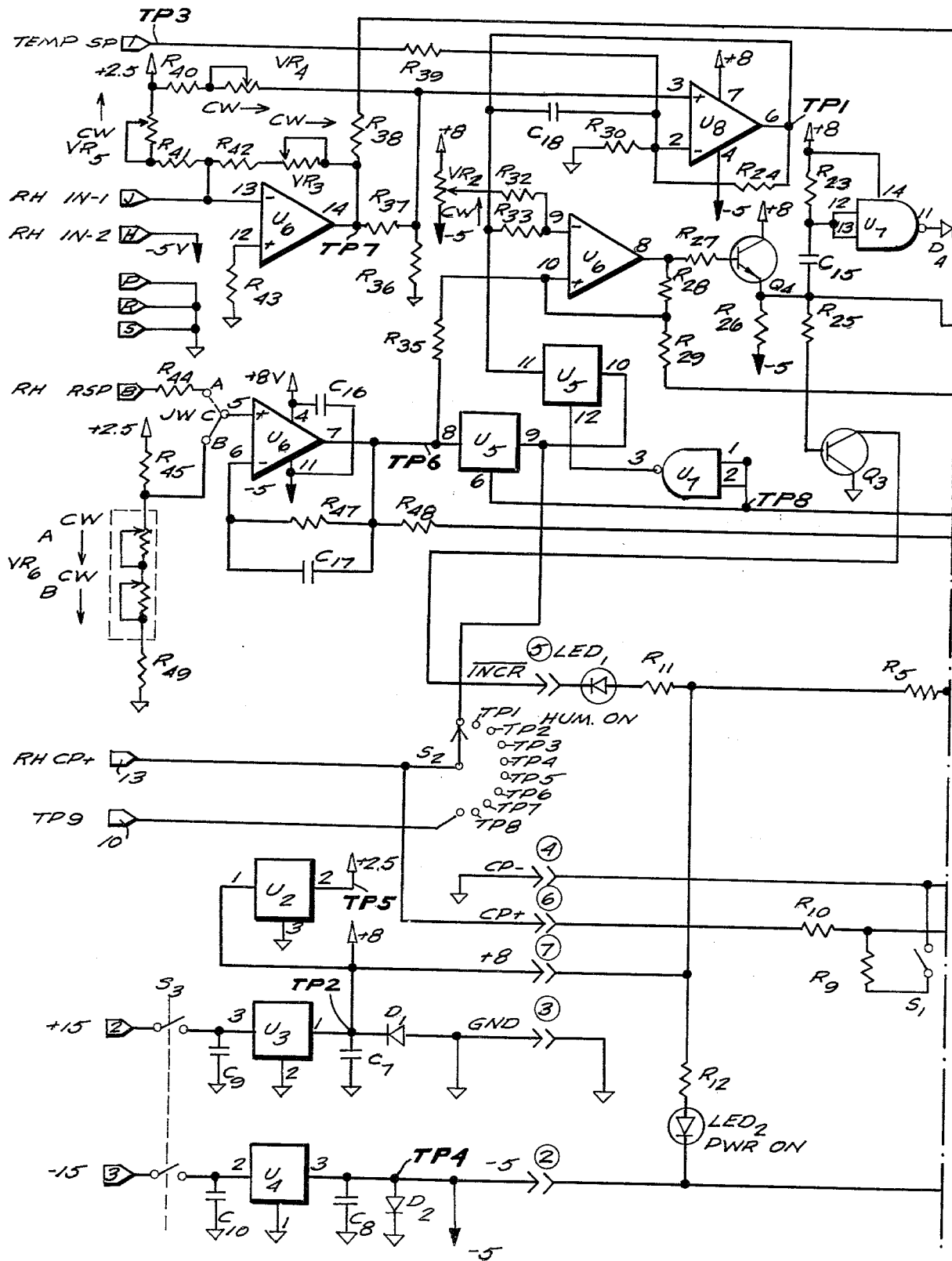
Figure 19A:
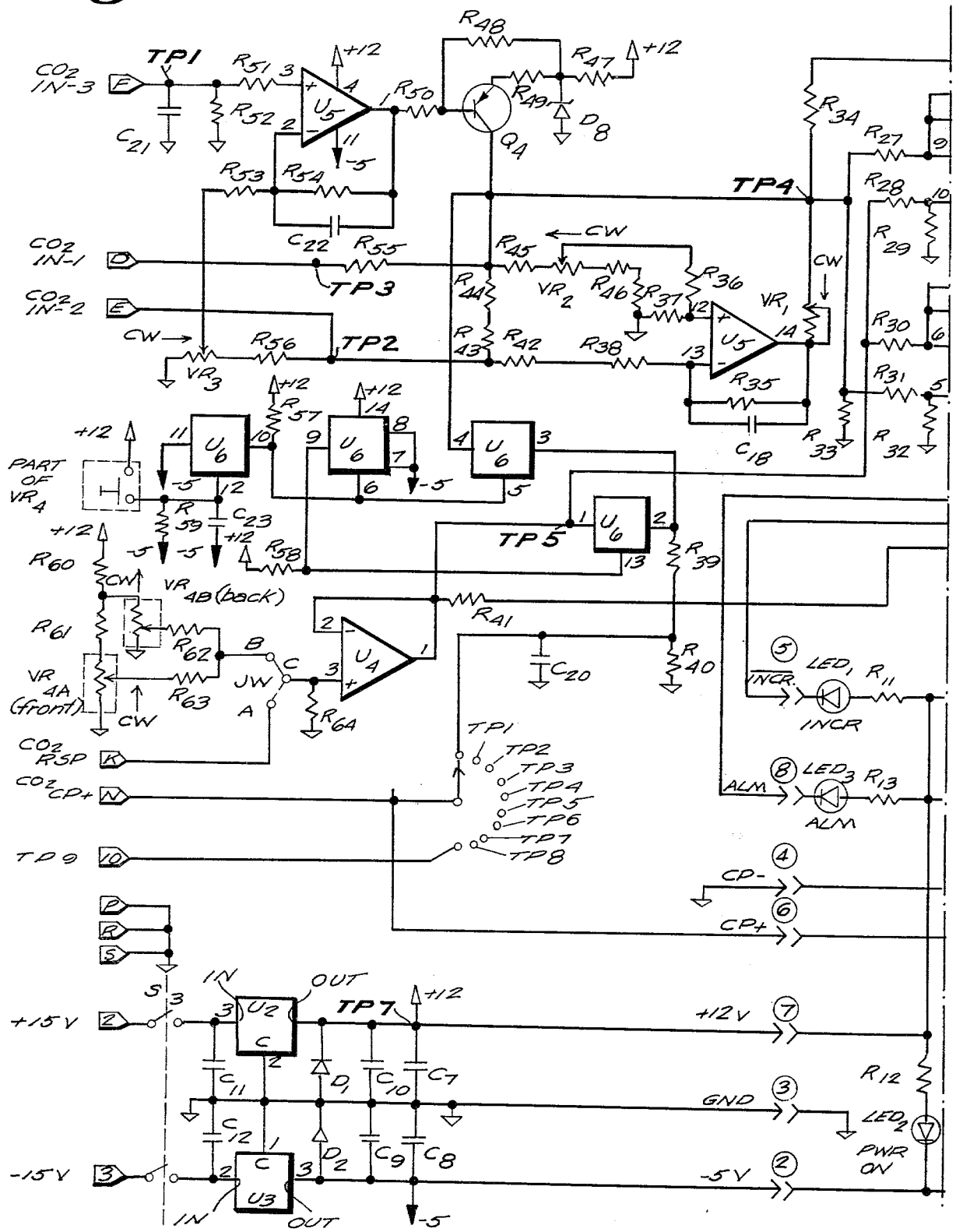

Typically, when the incubator is in operation, the temperature setpoint is selected and temporarily displayed on the voltmeter readout 104, by using the control knob 106 as explained above. In addition, the dial 76 of the over-temperature safety thermostat 78 may be set somewhat above the aforesaid temperature setpoint. Should the heaters for some reason of malfunction or maladjustment raise the incubator chamber temperature to above the temperature set on the dial 76, over-temperature indicator 80 will light and an associated audible alarm 130 (FIG. 15) will sound.

For a typical incubator 10, the temperature setpoint may be selected to be anywhere in the range from 4° C. above ambient to 60° C., and the controller 84 will in steady state maintain this temperature to within 0.1° C. Preferably the temperature controller works by the time-proportional method, in order to avoid overshoot upon reaching the setpoint.

FIG. 10 shows the relative humidity ("RH") control module 86 is similar in many respects to the temperature control module. It incorporates a voltmeter with an L.E.D. digital readout at 132. Normally this readout window displays the actual relative humidity within the incubator chamber, as sensed at 48. However, if the knob 134 of the relative humidity set control is momentarily pushed-in, the digital readout window 132 will display the relative humidity setpoint which has been selected for this control module. The setpoint may be changed by rotating the control knob 134. While the control knob 134 is in a manually pushed-in condition, and for about twenty seconds thereafter, the setpoint relative humidity will be displayed in the readout window 132. After about twenty seconds following release, the readout window 132 will revert to displaying the actually sensed relative humidity.

Element 136 is an on/off switch for the relative humidity control module. When this switch is "on", the power indicator light 138 will remain lit. When the setpoint relative humidity lies above the relative humidity being sensed, the humidity indicating light 140 will remain lit. The float valve 46 of the automatic water level control opens as the float lowers below a preset threshold, in order to admit water to the reservoir 50 from the fill bottle 20. Relative humidity is modulated by the control module 86 principly by operation of the heaters 44, 54. Typically, the humidity may be controlled in one percent increments at all setpoints from 50 percent to 96 percent, depending on ambient humidity. To establish and maintain a low relative humidity it may be necessary to wholly or partly empty the reservoir 50, and turn off the valve 46 and/or empty or close-off the fill bottle 20, and then to run the heaters 44 and/or 54 for a while, with the door 12 ajar.

In normal operation, the faceplate 142 of the relative humidity control module 86 is flush with the control panel faceplate 116 of the chassis of the incubator 10, so that the rest of what is shown in FIG. 10 is out of sight and inaccessible. Back of the module faceplate 142 is a mechanical structure 144 which mounts a low voltage electronic circuit board 146 with a number of circuitry components provided on it. Conspicuous among these are the test switch RH S1 which is shown having positions A and B, test switch RH S2 which is shown having positions 0–9, and, accessible at the front left through a slot 148 in the respective mechanical structure bracket 150 respectively (rear to front) for zero, span, offset, (undesignated), and humidity.

Projecting laterally rearwardly at the rear edge of the low voltage electronic circuit board 146 is a tab 152 bearing a row of individual electrical connector contacts 154 which lead to and from the various circuitry elements on the board 146.

When the incubator is in normal use, the switch RH S1 is in position A, the switch RH S2 is in position 0 and the tab 152 is plugged into the mother board receptable 100.

Typically, when the incubator is in operation, the relative humidity setpoint is selected and temporarily displayed on the voltmeter readout 132, by using the control knob 134 as explained above.

FIG. 11 shows the control module for monitoring the major constituent of the artificial atmosphere maintained within the incubator chamber. In this instance, the artificial atmosphere is created by the injection of carbon dioxide, so the module 88 is a carbon dioxide ("$CO_2$") control module. It incorporates a voltmeter with an L.E.D. digital readout at 156. Normally this readout window displays the actual percentage $CO_2$ in the artificial atmosphere of the incubator chamber, as sensed by the $CO_2$ sensor 40. However, if the knob 158 of the $CO_2$ set control is momentarily pushed-in, the digital readout window 156 will display the percentage $CO_2$ to which this control is set. The setpoint may be changed by rotating the control knob 158. While the control knob 158 is in a manually pushed-in condition, and for about twenty seconds thereafter, the setpoint percentage $CO_2$ will be displayed in the readout window 156. After about twenty seconds following release, the readout window 156 will revert to displaying the actually sensed percentage $CO_2$.

Element 160 is an on/off switch for the $CO_2$ control module. When this switch is "on", the power indicator light 162 will remain lit. When the setpoint percentage $CO_2$ lies above the percentage $CO_2$ being sensed, the solenoid valve 66 is opened to admit $CO_2$ through the pipe 64 from the supply tank (not shown) connected to the $CO_2$ inlet fitting 61. While $CO_2$ is being admitted to the incubator chamber, the $CO_2$ inject indicator light 164 will remain lit.

Should the percentage $CO_2$ in the incubator chamber as sensed drift, e.g. 1 percent or more from the setpoint selected, the alarm light 166 will light and an audible alarm 168 (FIG. 15) will sound. In order to avoid unwanted signalling, e.g. when the front door 12 is intentionally opened, a silencer button 170 is provided. It will cut out the alarm for so long as it is held in a pushed-in condition. In order to permit the visual and audible alarms from being continuously given when the user intentionally is not using a $CO_2$ atmosphere in the chamber, the alarm system may be simply turned off by using a normally hidden alarm defeat switch 172.

In normal operation, the faceplate 174 of the $CO_2$ control module 88 is flush with the control panel faceplate 116 of the chassis of the incubator 10, so that the rest of what is shown in FIG. 11 is out of sight and inaccessible.

A zero alignment screw for the voltmeter readout is shown provided on the faceplate 174 at 176.

Back of the faceplate 174 is a mechanical structure 178 which mounts a low voltage electronic circuit board 180 with a number of circuitry components provided on it. Conspicuous among these are test switch $CO_2$ S1, which is shown having positions A and B, test switch $CO_2$ S2, which is shown having positions 0–9, and, accessible at the front left through a slot 182 in the respective mechanical bracket 118 are voltmeter alignment screws 184 respectively (rear to front) for current, span (and the aforementioned alarm defeat switch 172).

Projecting laterally rearwardly at the rear edge of the low voltage electronic circuit board 180 is a tab 186 bearing a row of individual electrical connector contacts 188 which lead to and from the various circuitry elements on the board 180.

When the incubator 10 is in normal use, the switch $CO_2$ S1 is in position A, the switch $CO_2$ S2 is in position 0 and the tab 186 is plugged into the mother board receptable 102.

Typically, when the incubator is in operation, the $CO_2$ setpoint is selected and temporarily displayed in the voltmeter readout window 156, by using the control knob 158 as explained above.

(Off the module 88, a $CO_2$ sample port 190 is shown provided near the bottom of the faceplate 116 of the chassis. This permits the user to check $CO_2$ percentage by means independent of the module 88, e.g. using a conventional Fyrite $CO_2$ measuring instrument 192, or the like which is for that purpose temporarily connected with the $CO_2$ sampler 34. This permits the checking to be performed without opening the door 12.)

Since the $CO_2$ sensor 40, which is preferably a thermal-type, is affected by changes in heat and water content of the internal atmosphere, the $CO_2$ readout should be standardized each time the temperature or humidity setpoint is changed. This may be done using a standardizing procedure which requires use of the independent $CO_2$ measuring instrument 192, adjusting the screw 176 until the readout at 156 agrees with that provided with the instrument 192. Alternatively, without using the instrument 192, the $CO_2$ supply may be cut off, the chamber 14 aired-out and the screw 176 adjusted until the readout at 156 is zero. Accurate calibration requires use of the instrument 192.

Referring to FIG. 6, the logo module 90 is, in effect, a storage compartment for an extender board 194. Behind the faceplate 196 which bears the logo 92 on its front, the logo module 90 includes mechanical brackets 198 to which the extender board 194 is removably held, e.g. by poppet bead-like fasteners 200 frictionally held in corresponding openings 202. The extender board 194 is a card 204, e.g. two inches long (from front to back) having a tab 206 at its rear edge which has a plurality of electrical connector contacts 208. Along its front edge, the card 204 is provided with an electrical receptacle 210. Corresponding electrical leads 212 run separately along the card from the receptacle 210 to the set of contacts 208, so that each lead connects a distinct pair of contacts.

In effect, the tab 206 and contacts 208 on the extender board 194 are a mechanical and electrical equivalent of the corresponding structures 126, 128 on the temperature control module 84, the corresponding structures 152, 154 on the relative humidity control module 86, and the corresponding structures 186, 188 on the $CO_2$ control module 88, and the receptacle 210 is a mechanical and electrical equivalent of the plug-in receptacles 98, 100 and 102 in the mother board 96.

TROUBLE SHOOTING

Temperature

See FIGS. 6–9, 12 and 17.

If the temperature control module 84 appears to be malfunctioning, the procedure laid-out on FIG. 12 should be followed.

Steps 1–3 do not require use of the extender board 194.

Step 4 is explained in more detail as follows.

Turn the temperature control module 84 off at 108 and pull on the fastener 94 to bodily remove the temperature control module from the control panel. Also pull out the logo module 90, remove the extender board 194 from it. Insert the extender board 194, tab edge first, into the slot from which the temperature control module was removed and plug the tab 206 into the receptacle 98 in the mother board 96. Now plug the tab 126 of the temperature control module 84 into the receptacle 210 of the extender board.

In essence, the temperature control module has, by the simply-executed foregoing procedure been displaced a predetermined distance, e.g. two inches, outwards, so that some of its structure that is normally hidden behind the faceplate 114 is now accessible for manipulation. Particularly, what has been made accessible is the switches T S1 and T S2, and the alignment screws 124 for zero, span and offset. In this extended condition, the temperature control module 84 is completely operable.

Steps 5–17, as needed, may be performed as called-for on the trouble shooting chart of FIG. 12.

Relative Humidity

See FIGS. 6–8, 10, 13 and 18.

The trouble shooting steps are set forth on the trouble shooting chart of FIG. 13.

$CO_2$

See FIGS. 6–8, 11, 14 and 19.

Figure 14A:
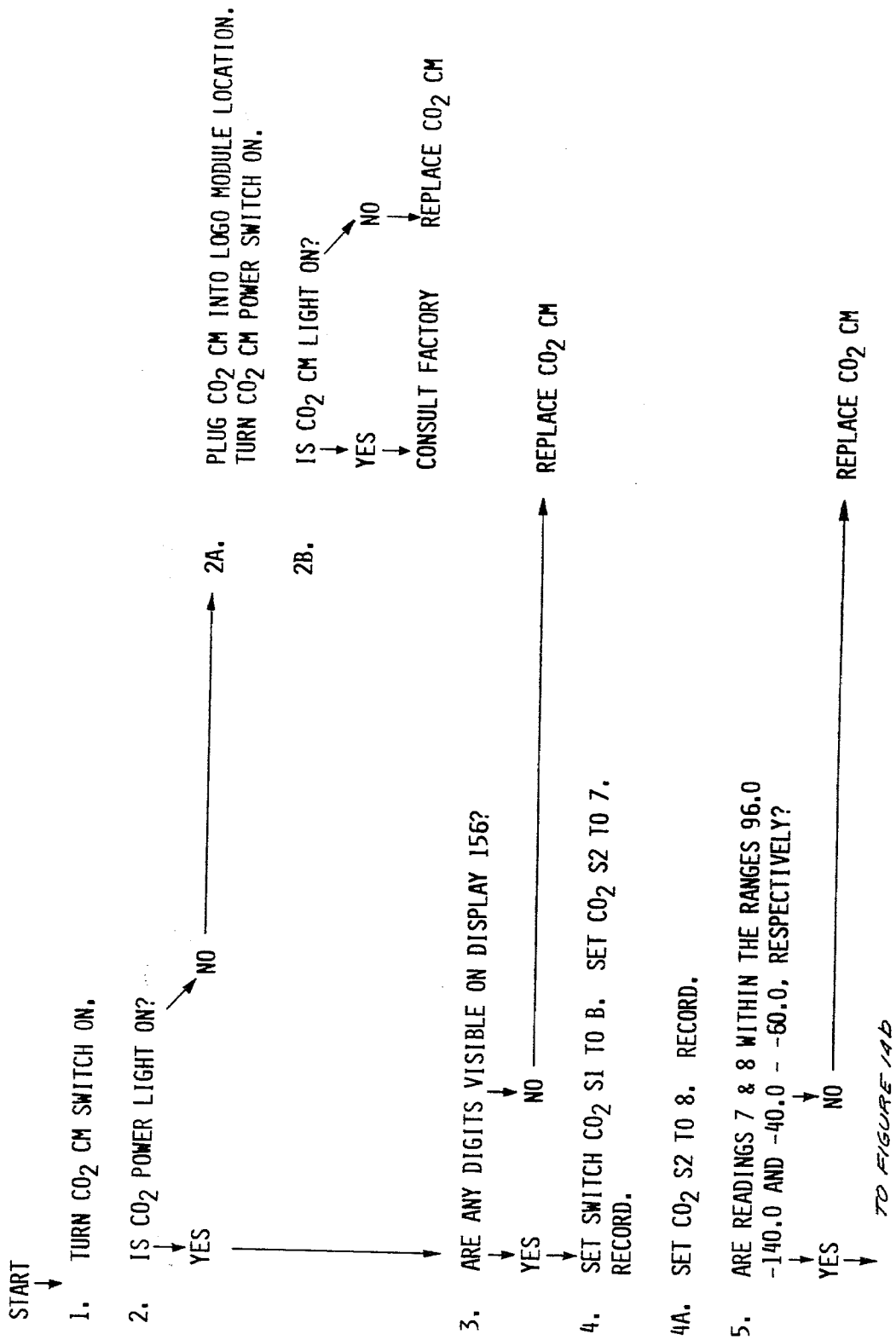
Figure 14B:
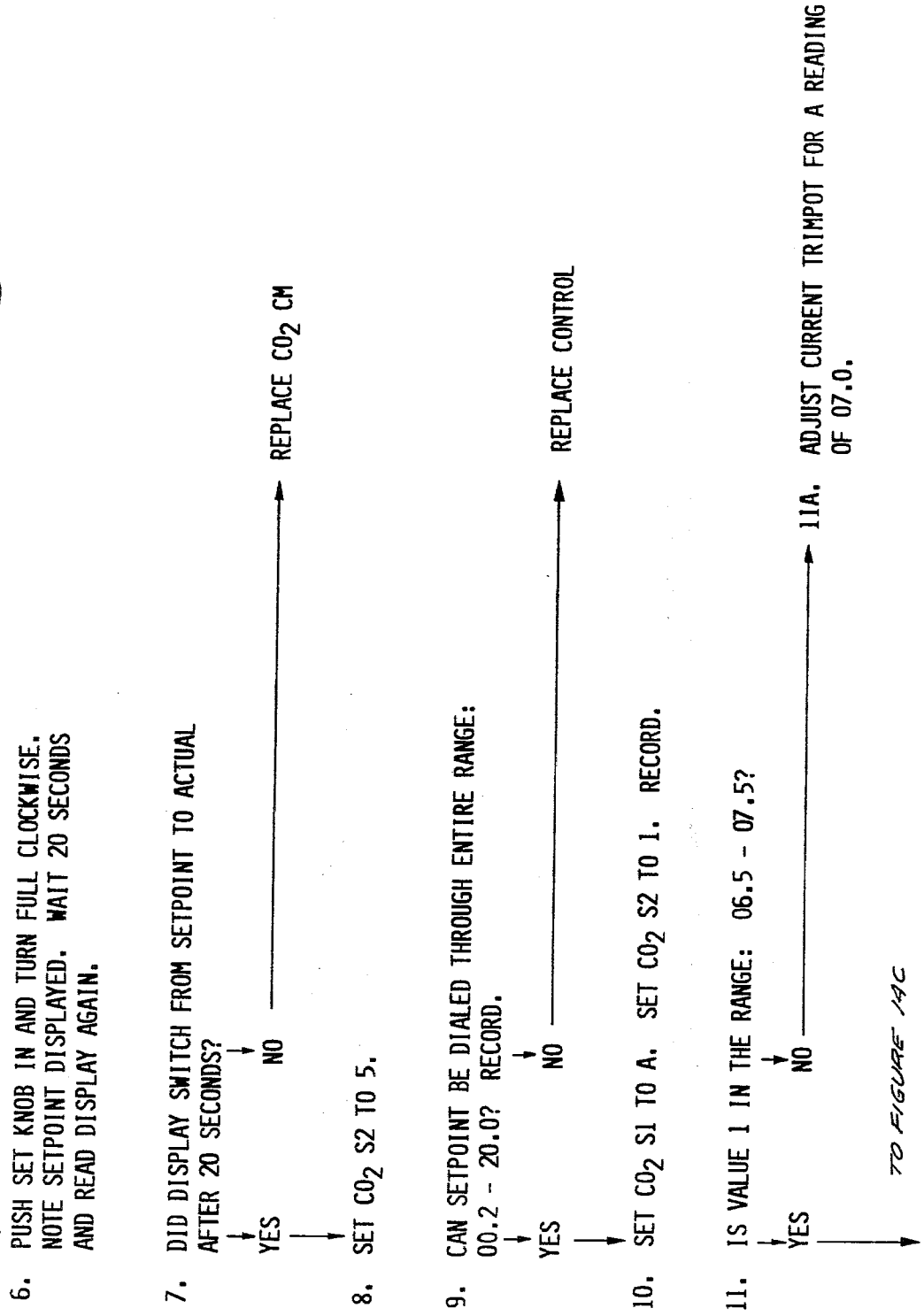

The trouble shooting steps are set forth on the trouble shooting charge of FIG. 14.

It should now be apparent that the modular incubator control system with self-test capability as described hereinabove, possesses each of the attributes set forth in the specification under the heading "Summary of the Invention" hereinbefore. Because it can be modified to some extent without departing from the principles thereof as they have been outlined and explained in this specification, the present invention should be understood as encompassing all such modifications as are within the spirit and scope of the following claims.

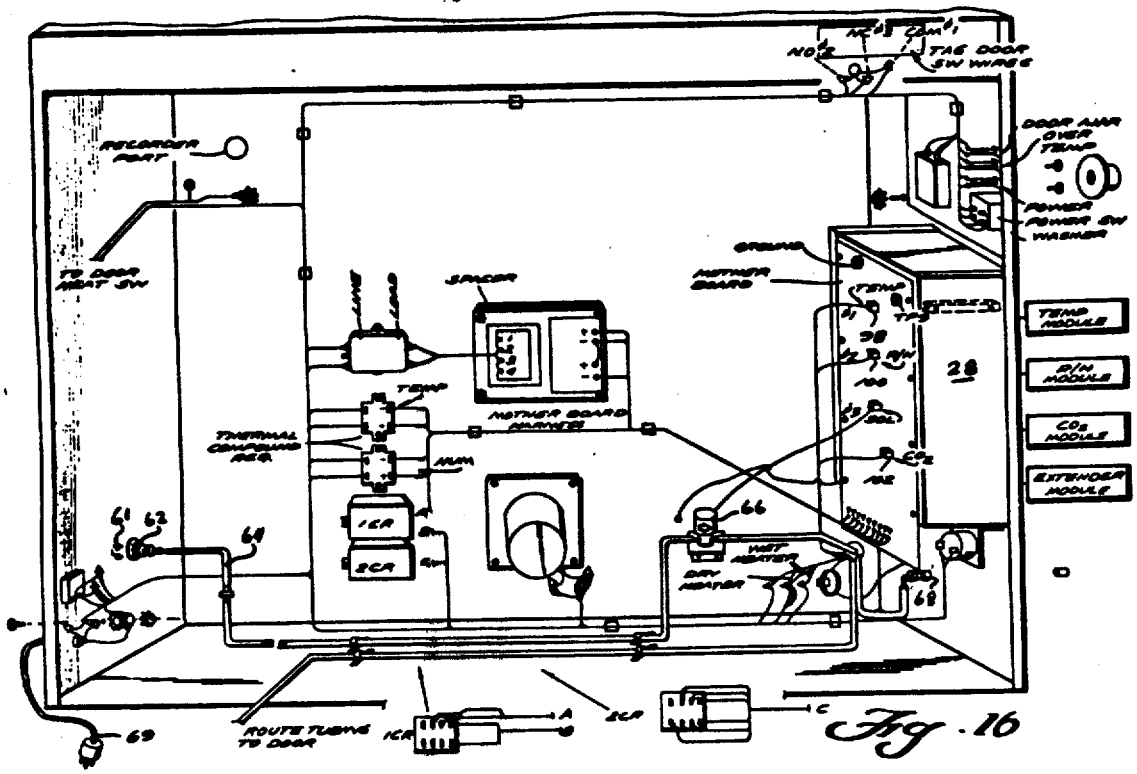

What is claimed is:

1. A modular incubator control system with self-testing capability, said system comprising:

a frame structure having plural electrical plug connectors;

plural incubator control modules;

each module including electronic means for monitoring and controlling at least one condition of the incubator's internal incubated environment and having a respective front panel portion normally visible to an incubator operator and a rear portion plug-connectable with said frame structure at a respectively corresponding one of said plug connectors;

each said electronic means including voltage measuring and indicating means having an input for measuring the magnitude of a voltage and for visually displaying a numerical representation of that voltage at the front panel portion of its respective module;

each said electronic means having electronic circuits and also including multiposition test switch means disposed behind said front panel in a position that is not normally accessible to an operator and connected to selectively connect the input of its respective voltage measuring and indicating means to a selected one of plural predetermined points within its electronic circuits, each said multiposition test switch means having a normal position in which its respective module operates normally to monitor and visually display the value of its respective environmental condition and having plural test positions in each of which the module displays, for diagnostic test purposes, a representation of the electrical voltage at a corresponding predetermined position within its electrical circuits; and circuit extension means selectively connectable between any of said plug connectors and its associated control module for physically positioning the module to permit ready operator access to said multiposition test switch means while still leaving the module fully operable through electrical connection with its respective plug connector when it is desired to perform diagnostic tests.

2. A modular incubator control system with self-testing capability as in claim 1 wherein said circuit extension means comprises a printed circuit structure detachably mounted in a separate module behind a front panel.

3. A modular incubator control system with self-testing capability as in claim 2 wherein said printed circuit structure is also plug connectable with a respectively corresponding one of said plug connectors on the frame structure when stowed behind the front panel of said separate module.

4. A modular incubator control system with self-testing capability as in claims 1, 2 or 3 wherein all front panels of all modules are substantially co-planar when connected with their respective plug connectors on said frame structure.

5. A modular incubator control system with self-testing capability as in claims 1, 2 or 3 further comprising:
 a trouble shooting chart including a representation of expected visual displays for predetermined positions of each multiposition test switch means under predetermined incubator environmental conditions.

6. A modular incubator control system with self-testing capability as in claims 1, 2 or 3 wherein said monitored and controlled environmental conditions include temperature, relative humidity and carbon dioxide content.

* * * * *

UNITED STATES PATENT AND TRADEMARK OFFICE
CERTIFICATE OF CORRECTION

PATENT NO. : 4,340,859

DATED : July 20, 1982

INVENTOR(S) : Max F. Farley

Page 1 of 3

It is certified that error appears in the above-identified patent and that said Letters Patent is hereby corrected as shown below:

Figures 1 and 16 should appear as shown on the attached sheets.

Signed and Sealed this

Twenty-third Day of November 1982

[SEAL]

Attest:

Attesting Officer

GERALD J. MOSSINGHOFF

Commissioner of Patents and Trademarks

UNITED STATES PATENT AND TRADEMARK OFFICE
CERTIFICATE OF CORRECTION

PATENT NO. : 4,340,859

DATED : July 20, 1982

INVENTOR(S) : Max F. Farley

It is certified that error appears in the above-identified patent and that said Letters Patent is hereby corrected as shown below:

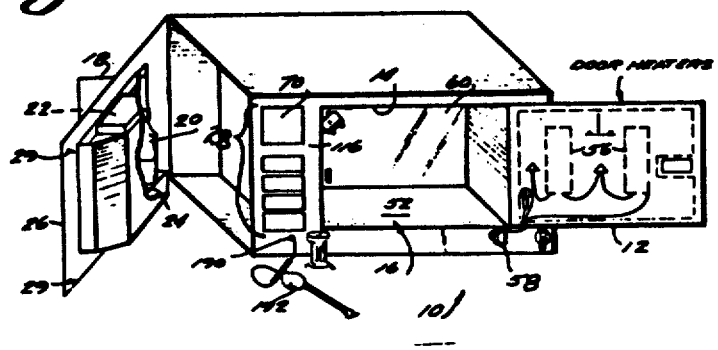

UNITED STATES PATENT AND TRADEMARK OFFICE
CERTIFICATE OF CORRECTION

PATENT NO. : 4,340,859

DATED : July 20, 1982

INVENTOR(S) : Max F. Farley

Page 3 of 3

It is certified that error appears in the above-identified patent and that said Letters Patent is hereby corrected as shown below: